(12) United States Patent
Kurauchi

(10) Patent No.: US 7,683,819 B2
(45) Date of Patent: Mar. 23, 2010

(54) ANALOG-TO-DIGITAL CONVERTING CIRCUIT

(75) Inventor: Akira Kurauchi, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 64 days.

(21) Appl. No.: 12/071,125

(22) Filed: Feb. 15, 2008

(65) Prior Publication Data

US 2008/0198057 A1 Aug. 21, 2008

(30) Foreign Application Priority Data

Feb. 19, 2007 (JP) ............................. 2007-037955

(51) Int. Cl.
*H03M 1/12* (2006.01)
(52) U.S. Cl. .................. 341/172; 341/118; 341/120; 341/155; 341/161; 341/162
(58) Field of Classification Search ......... 341/118–122, 341/155, 161, 162, 172
See application file for complete search history.

(56) References Cited

U.S. PATENT DOCUMENTS

| | | | | |
|---|---|---|---|---|
| 5,594,445 A | * | 1/1997 | Ginetti | 341/162 |
| 5,771,012 A | * | 6/1998 | Shu et al. | 341/118 |
| 6,784,814 B1 | * | 8/2004 | Nair et al. | 341/118 |
| 6,914,550 B2 | * | 7/2005 | Cai | 341/155 |
| 6,954,169 B1 | * | 10/2005 | Min | 341/172 |
| 7,002,507 B2 | * | 2/2006 | Kobayashi et al. | 341/162 |
| 7,250,895 B2 | * | 7/2007 | Kurose et al. | 341/155 |
| 7,265,705 B1 | * | 9/2007 | Lee et al. | 341/162 |
| 7,471,227 B2 | * | 12/2008 | Cho | 341/161 |
| 2005/0078026 A1 | * | 4/2005 | Cai | 341/162 |
| 2009/0128391 A1 | * | 5/2009 | Bailey et al. | 341/172 |

OTHER PUBLICATIONS

Min, Byung-Moo, et al., "A 69-mW 10-bit 80-MSample/s Pipelined CMOS ADC"; IEEE Journal of Solid State Circuits, vol. 38, No. 12, Dec. 2003, pp. 2031-2039.

Cho, Thomas Byunghak, et al., "A 10 b, 20 Msample/s, 35 mW Pipeline A/D Converter", IEEE Journal of Solid-State Circuits, vol. 30, No. 3, Mar. 1995, pp. 166-172.

* cited by examiner

*Primary Examiner*—Linh V Nguyen
(74) *Attorney, Agent, or Firm*—McGinn IP Law Group PLLC

(57) ABSTRACT

Disclosed is a pipeline ADC in which an operational amplifier is shared between circuit blocks that construct local A/D converters of nth and (n+1)th stages, a sampling capacitor of the nth stage is divided into a plurality of sampling capacitors, and some of the plurality of sampling capacitors thus divided in the nth stage are adopted as sampling capacitors of the (n+1)th stage.

22 Claims, 12 Drawing Sheets n stage local A/D

ANALOG-TO-DIGITAL CONVERTING CIRCUIT

REFERENCE TO RELATED APPLICATION

This application is based upon and claims the benefit of the priority of Japanese patent application No. 2007-037955, filed on Feb. 19, 2007, the disclosure of which is incorporated herein in its entirety by reference thereto.

FIELD OF THE INVENTION

This invention relates to an analog-to-digital converting circuit and, more particularly, to a pipeline analog-to-digital (AD) converting circuit.

BACKGROUND OF THE INVENTION

FIGS. 6A, 6B, 6C and 6D are diagrams schematically illustrating the general structure of a pipeline A/D converting circuit. With reference to FIG. 6A, this pipeline A/D converting circuit is an A/D converting circuit having a 1.5-bit/stage architecture. The converting circuit has cascade-connected stages 1 to 8, among which stages 1 to 7 produce identically configured 1.5-bit outputs (three values while stage 8 produces a 2-bit output (four values). The digital signals that are output from stages 1 to 8 are supplied to a digital error correction circuit (not shown). The digital error correction circuit adds the outputs from each of the stages and outputs a 10-bit digital value. As indicated in FIG. 6D, the digital error correction circuit adds the two bits of each of the stages 1 to 7 and the three bits of the stage 8 upon shifting these by one bit, thereby obtaining the 10-bit data.

As illustrated in FIG. 6B, a local A/D converter 10, which constitutes each stage of stages 1 to 7, includes a sample-and-hold circuit (SH) 101, a sub analog-to-digital converting circuit (sub A/D) 102, a sub digital-to-analog converting circuit (sub D/A) 103, a subtractor 104 and an amplifier 105 having an amplification factor of 2. The sub AD 102 converts an analog input (Vin) to 1.5 bits, the sub D/A 103 converts the digital signal from the sub A/D 102 to an analog signal, the subtractor 104 subtracts the output of the sub D/A 103 from the output voltage of the sample-and-hold circuit 101, and the amplifier 105 doubles and outputs the difference voltage that is output from the subtractor 104. Stage 8 has a 2-bit flash A/D.

As illustrated in FIG. 6C, the local A/D converter 10, which constitutes each stage of stages 1 to 7, includes capacitors Cf, Cs that sample the input signal (Vin). The digital-to-analog converting function is implemented by charging and discharging the capacitors Cf, Cs with a reference voltage. The capacitor Cf is connected as the feedback capacitor of an operational amplifier and the capacitor Cs is connected to the reference signal to amplify the difference voltage between the sampled voltage and the reference voltage. The residue signal of difference voltage ×2 is delivered to the next stage to achieve conversion having a finer resolution. The reference voltage is selected based upon the output of a flash sub A/D (1.5-bit flash A/D) that converts the input signal (Vin) to a 1.5-bit digital signal. The operational amplifier (op amp) has an inverting input terminal (−) connected to the common node of capacitors Cf and Cs, a non-inverting input terminal (+) connected to ground, with the inverting input terminal (−) and non-inverting input terminal (+) being connected by a switch, and an output terminal connected to one end of the capacitor Cf by a switch. In the arrangement shown of FIG. 6C, the 1.5-bit flash A/D corresponds to the sub A/D in FIG. 6B, the capacitors Cf and Cs perform the function of the sample-and-hold circuit (SH) 101 in FIG. 6B and serve as sampling capacitors for sampling the input signal Vin, the capacitor Cf is feedback-connected between the output terminal and inverting input terminal of the operational amplifier, and the capacitor Cs is connected between the reference voltage terminal and the inverting input terminal of the operational amplifier (op amp). With this arrangement, the functions of the subtractor 104 and amplifier (×2) 105 in FIG. 6B as well as that of the operational amplifier (op amp) are achieved.

FIG. 7 is a diagram showing an example of the details of construction in FIG. 6C. FIG. 7 shows an example of the circuit arrangements of a local A/D of an n stage and a local A/D of an (n+1) stage. (Note that in the case of the 8-stage structure of FIGS. 6A to 6D, n is 1 to 6.) In FIG. 7, switches designated by φ1, φ2, φ3 and φ4 represent switches on/off controlled by control signals φ1, φ2, φ3 and φ4, respectively. FIG. 8 is a diagram illustrating an example of timing waveforms of the control signals φ1, φ2, φ3 and φ4 that control the operation of the switches in FIG. 7.

In a period in which the local A/D of the n stage samples the signal from the preceding (n−1) stage in capacitors Cf1 and Cs1, the (n+1) stage that is the succeeding stage is such that capacitor Cf2 is connected as the feedback capacitor of the operational amplifier (op amp) and capacitor Cs2 is connected to the reference voltage, whereby calculation and amplification of the residual are performed.

In time period 1, switches on/off controlled by φ1 and φ2, respectively are turned on and differential-format signals Vinn[n−1], Ninp[n−1] are sampled in the capacitors Cf1 and Cs1 of the local A/D of the n stage. Further, the differential signals Vinn[n−1] and Vinp[n−1] are subjected to an A/D conversion by the sub A/D (1.5-bit flash A/D).

More specifically, first terminals of capacitors Cf1 and Cs1 of a first set provided on the side of the inverting input terminal (−) of the operational amplifier (op amp) are connected in common to Vinn [n−1] via the switches turned on by φ2, second terminals of capacitors Cf1 and Cs1 of the first set are connected in common to the common-mode voltage terminal Vcm via the switch turned on by φ1, first terminals of capacitors Cf1 and Cs1 of a second set provided on the side of the non-inverting input terminal (+) of the operational amplifier (op amp) are connected in common to Vinp[n−1] via the switches turned on by φ2, and second terminals of capacitors Cf1 and Cs1 of the second set are connected in common to the common-mode voltage terminal Vcm via the switch turned on by φ1. The switches controlled by φ3 and φ4, respectively, are turned off. Further, the local A/D of the n stage has a non-inverting output terminal (+) and an inverting output terminal (−) connected to each other via a switch turned on by φ1.

In the local A/D of the (n+1) stage, capacitor Cf2 of a first set is connected as a feedback capacitor between the non-inverting output terminal (+) and the inverting input terminal (−) of the operational amplifier (op amp) via a switch turned on by φ1, and capacitor Cf2 of a second set is connected as a feedback capacitor between the inverting output terminal (−) and the non-inverting input terminal (+) of the operational amplifier (op amp) via a switch turned on by φ1. Capacitor Cs2 of the first set is connected between the reference voltage and the inverting input terminal (−) of the operational amplifier (op amp), capacitor Cs2 of the second set is connected between the reference voltage and the non-inverting input terminal (+) of the operational amplifier (op amp), and the residual between sampled voltage and reference voltage is calculated and amplified.

In the local A/D of the (n+1) stage, the reference voltages to which the first terminals of the capacitors Cs2 of the first and second sets are connected are decided by the output of the sub A/D (1.5-bit flash A/D) of the (n+1) stage. For example, when the output of the sub A/D is "00", the first terminal of capacitor Cs2 of the first set is connected to reference voltage terminal Vrefp, and the first terminal of capacitor Cs2 of the second set is connected to reference voltage terminal Vrefn (switches φ2[00] are on). When the output of the sub A/D is "10", the first terminal of capacitor Cs2 of the first set is connected to reference voltage terminal Vrefn, and the first terminal of capacitor Cs2 of the second set is connected to reference voltage terminal Vrefp (switches φ2[10] are on).

In time period 2, control signals φ3 and φ4 are HIGH and control signals φ1, φ2 are LOW. In the local A/D of the n stage, the capacitors Cf1 of the first and second sets are connected as feedback capacitors of the operational amplifier (op amp), the capacitors Cs1 of the first and second sets are connected to the reference voltages and the residual is calculated and amplified. In the local A/D of the succeeding (n+1) stage, the capacitors Cf2 and Cs2 of the first and second sets sample the outputs of the local A/D of the n stage, and the outputs of the local A/D of the n stage are subjected to the A/D conversion by the sub A/D (1.5-bit flash A/D) of the (n+1) stage.

More specifically, in the local A/D of the n stage in time period 2, the capacitors Cf1 of the first and second sets are connected as feedback capacitors between the non-inverting output terminal (+) and inverting input terminal (−) and between the inverting output terminal (−) and non-inverting input terminal (+), respectively, of the operational amplifier (op amp). The capacitors Cs1 of the first and second sets are connected between the reference voltage and the inverting input terminal (−) of the operational amplifier (op amp) and between the reference voltage and non-inverting input terminal (+), respectively, of the operational amplifier (op amp).

In the local A/D of the n stage, the reference voltages to which the capacitors Cs1 of the first and second sets are connected are decided by the output of the sub A/D (1.5-bit flash A/D) of the n stage. For example, when the output of the sub A/D is "00", the first terminals of capacitors Cs1 of the first and second sets are connected to reference voltage terminals Vrefp and Vrefn, respectively (switches φ4[00] are on). When the output of the sub A/D is "10", the first terminals of capacitors Cs1 of the first and second sets are connected to reference voltage terminals Vrefn and Vrefp, respectively (switches φ4[10] are on). When the output of the sub A/D is "01", the first terminal of capacitor Cs1 of the first set and the first terminal of capacitor Cs1 of the second set are connected to each other (switch φ4[01] is on).

In time period 3, control signals φ1 and φ2 are HIGH and control signals φ3 and φ4 are LOW. In the sampling time period of the output of the preceding stage in the local A/D of the n stage, the capacitors Cf2 of the first and second sets in the local A/D of the (n+1) stage are connected as feedback capacitors of the operational amplifier (op amp), capacitors Cs2 of the first and second sets are connected to the reference voltages and the residual is calculated and amplified.

In time period 4, control signals φ3 and φ4 are HIGH and control signals φ1 and φ2 are LOW. In the local A/D of the n stage, the capacitors Cf1 of the first and second sets are connected as feedback capacitors, the capacitors Cs1 of the first and second sets are connected to the reference voltages and the residual is calculated and amplified. In the local A/D of the (n+1) stage, which is the next stage, the capacitors Cf2 and Cs2 of the first and second sets sample the outputs of the local A/D of the n stage, and the outputs of the local A/D of the n stage are subjected to the A/D conversion by the sub A/D (1.5-bit flash A/D) of the (n+1) stage.

As described above, in the sampling time period during which the outputs of the preceding stage are sampled by the local A/D of the n stage, the local A/D of the (n+1) stage calculates and amplifies the residual that in the outputs of the local A/D of the n stage sampled in the preceding cycle, and the local A/D of the (n+1) stage samples the outputs of the local A/D of the n stage in the period during which the residual is calculated and amplified by the local A/D of the n stage.

In the example illustrated in FIG. 7, the local A/D of the n stage and the local A/D of the (n+1) stage have respective operational amplifiers (op amp). However, an example in which an operational amplifier (op amp) is shared between the local A/D of the n stage and the local A/D of the (n+1) stage also is known (for example, see Non-Patent Document 1).

FIG. 9 is a diagram illustrating an example of a structure in which an operational amplifier (op amp) is shared between n and (n+1) stages in the pipeline A/D converting circuit of FIG. 6. In FIG. 9, switches designated by φ1, φ2, φ3 and φ4 represent switches turned on and off by control signals φ1, φ2, φ3 and φ4, respectively. The timing waveforms of the control switches φ1 to φ4 that on/off control the respective switches in FIG. 9 are in accordance with the example depicted in FIG. 8. FIGS. 10, 11 and 12 illustrate, in an extracted manner, the connections formed in the circuit of FIG. 9 in time periods 1, 2 and 3, respectively.

In time period 1, as shown in FIG. 10, the switches controlled by the control signals φ1 and φ2 are turned on, and the switches controlled by the control signal φ3 are turned off. In the local A/D of the n stage, differential output signals from the local A/D of the (n−1) stage that are supplied to differential signal input terminals Vinn[n−1], Vinp[n−1] are sampled in the capacitors Cf1 and Cs1 of the first and second sets, respectively, and the output signals of the local A/D of the (n−1) stage are subjected to an A/D conversion by the sub A/D (1.5-bit flash A/D).

More specifically, with reference to FIG. 10, first terminals of the capacitors Cs1 and Cf1 of the first set are connected in common to the input terminal (inverted-input terminal) Vinn[n−1] via the switches turned on by φ2, and commonly connected second terminals of the capacitors Cs1 and Cf1 of the first set are connected to the common-mode voltage terminal Vcm via the switches turned on by φ1. First terminals of the capacitors Cs1 and Cf1 of the second set are connected in common to the input terminal (non-inverted-input terminal) Vinp[n−1] via the switches turned on by φ2, and commonly connected second terminals of the capacitors Cs1 and Cf1 of the second set are connected to the common-mode voltage terminal Vcm via the switches turned on by φ1.

In time period 1, the operational amplifier (op amp) is isolated from the capacitors Cs1 and Cf1 by the switches controlled by control signal φ3 and does not provide the function of an operational amplifying circuit in the local A/D of the n stage (this is the idle state).

Next, in time period 2, as shown in FIG. 11, the switches controlled by the control signals φ3 and φ4, respectively, are turned on, and the switches controlled by the control signals φ1 and φ2, respectively, are turned off. The local A/D of the n stage amplifies the difference voltage between the sampled output voltage of the preceding (n−1) stage and the reference voltage and outputs the amplified difference voltage to the (n+1) stage, which is the next stage. That is, the first terminal of the capacitor Cf1 of the first set is connected to the non-inverting output terminal (+) of the operational amplifier (op amp) via the switch turned on by φ3, and the second terminal of the capacitor Cf1 of the first set is connected is common with the second terminal of the capacitor Cs1 of the first set and, via the switch turned on by φ3, with the inverting input terminal (−) of the operational amplifier (op amp). The first terminal of the capacitor Cs1 of the first set is connected to the reference voltage terminal Vrefn (selected by the output of the sub A/D) via the switch turned on by φ4.

The first terminal of the capacitor Cf1 of the second set is connected to the inverting output terminal (−) of the operational amplifier (op amp) via the switch turned on by φ3, and the second terminal of the capacitor Cf1 of the second set is connected is common with the second terminal of the capacitor Cs1 of the second set and, via the switch turned on by φ3, with the non-inverting input terminal (+) of the operational amplifier (op amp). The first terminal of the capacitor Cs1 of the second set is connected to the reference voltage terminal Vrefp (selected by the output of the sub A/D) via the switch turned on by φ4.

During time period 2, in a manner similar to time period 1, the local A/D of the (n+1) stage samples the output voltages (differential output voltages) from the local A/D of the preceding n stage in the capacitors Cs2 and Cf2 of the first and second sets, and the outputs of the n stage are subjected to the A/D conversion by the sub A/D (1.5 bit flash A/D). Further, the switches controlled by φ1 are placed in the off state so that the capacitors Cs2 and Cf2 are isolated from the operational amplifier (op amp). In time period 2, the operational amplifier (op amp) functions as the operational amplifier of the local A/D of the n stage.

That is, the first terminals of the capacitors Cf2 and Cs2 of the first set in the local A/D of the (n+1) stage are connected in common to a node (N2) at the connection between the first terminal of the capacitor Cf1 of the second set in the local A/D of the n stage and the inverting output terminal (−) of the operational amplifier via the switches turned on by φ4. The commonly connected second terminals of the capacitors Cf2 and Cs2 of the first set are connected to the common-mode voltage terminal Vcm via the switch turned on by φ3. The first terminals of the capacitors Cf2 and Cs2 of the second set in the local A/D of the (n+1) stage are connected to a node (N1) at the connection between the first terminal of the capacitor Cf1 of the first set in the local A/D of the n stage and the non-inverting output terminal (+) of the operational amplifier (op amp) via the switches turned on by φ4. The commonly connected second terminals of the capacitors Cf2 and Cs2 of the second set are connected to the common-mode voltage terminal Vcm via the switch turned on by φ3. It should be noted that in the case of the arrangement shown in FIG. 11, the capacitors Cf2 and Cs2 of the local A/D of the (n+1) stage appear as a load to the operational amplifier (op amp).

In time period 3, as shown in FIG. 12, the switches controlled by φ1 and φ2, respectively, are turned on, the switches controlled by φ3 are turned off and the operation of the local A/D of the n stage is similar to that in time period 1. In the local A/D of the (n+1) stage, the capacitors Cf2 of the first and second sets undergo an inversion of polarity and are connected to the operational amplifier (op amp) as feedback capacitors. That is, the commonly connected second terminals of the capacitors Cf2 and Cs2 of the first set (the terminals that were connected to the common-mode voltage terminal Vcm in time period 2) are connected to the inverting input terminal (−) of the operational amplifier (op amp) via the switch turned on by φ1. The first terminal of the capacitor Cf2 of the first set [the end that was connected to the inverting output terminal (−) of the operational amplifier (op amp) in time period 2] is connected to the non-inverting output terminal (+) of the operational amplifier (op amp) via the switch turned on by φ1. The first terminal of the capacitor Cs2 of the first set [the end that was connected to the inverting output terminal (−) of the operational amplifier (op amp) in time period 2] is connected to the reference voltage terminal Vrefp via the switch turned on by φ2.

The commonly connected second terminals of the capacitors Cf2 and Cs2 of the second set (the terminals that were connected to the common-mode voltage terminal Vcm in time period 2) of the local A/D of the (n+1) stage are connected to the non-inverting input terminal (+) of the operational amplifier (op amp) via the switch turned on by φ1. The first terminal of the capacitor Cf2 of the second set [the end that was connected to the non-inverting output terminal (+) of the operational amplifier (op amp) in time period 2] is connected to the inverting output terminal (−) of the operational amplifier (op amp) via the switch turned on by φ1. The first terminal of the capacitor Cs2 of the second set [the end that was connected to the non-inverting output terminal (+) of the operational amplifier (op amp) in time period 2] is connected to the reference voltage terminal Vrefn via the switch turned on by φ2.

As a result of the A/D conversion of the outputs of the local A/D in the n stage, the connection is made to the reference voltage terminal Vrefp via the switch controlled by φ2 and the operational amplifier (op amp) calculates and amplifies the residual. In the local A/D of the n stage, Vinn[n−1] and Vinp[n−1] are sampled in the capacitors Cf1 and Cs1, respectively.

In the local A/D of the (n+1) stage, this time period is one in which the local A/D of the n stage does not require the operational amplifier (op amp). Therefore, the operational amplifier (op amp) can be made to function as the operational amplifier (op amp) in the local A/D of the (n+1) stage. Accordingly, in time period 3, the local A/D of the (n+1) stage is capable of operationally amplifying the residual between the sampled output from the n stage and the reference voltage corresponding to the output of the sub A/D using the operational amplifier (op amp) and can output the resultant signal to the (n+2) stage.

In the final time period 4, the local A/Ds of the n and (n+1) stages perform an operation similar to that in time period 2, and by repeating the operations of time periods 3 and 4 from this point onward, a pipeline-type A/D conversion proceeds.

[Non-Patent Document 1]
IEEE JOURNAL OF SOLID-STATE CIRCUITS, Vol. 38, NO. 12, December 2003, pp. 2031-2039, "A 69-mW 10-bit 80-MSample/s Pipelined CMOS ADC"

[Non-Patent Document 2]
IEEE JOURNAL OF SOLID-STATE CIRCUITS, Vol. 30, NO. 3, March 1995, pp. 166-172, "A 10 b, 20 MSample/s, 35 mW Pipeline A/D Converter"

SUMMARY OF THE DISCLOSURE

The entire disclosure of Non-Patent Documents 1 and 2 are incorporated herein by reference thereto.

In the conventional pipeline A/D converting circuits described above, scaling of the capacitance values of every local A/D converter is not achieved by the local A/D converters of the n and (n+1) stages that share the operational amplifier (op amp). This results in a decline in speed or hinders a reduction in circuit current in the local A/D of the n stage.

Furthermore, with regard to the outputs of the local A/D of the (n+1) stage sharing the operational amplifier (op amp), the error voltage (offset voltage) produced by the shared operational amplifier (op amp) is amplified only by a factor of three if "a feedback signal polarity inverting (FSPI) technique" indicated on page 2033 of Non-Patent Document 1 (IEEE JOURNAL OF SOLID-STATE CIRCUITS, Vol. 38, NO. 12, December 2003, pp. 2031-2039) is not applied.

That is, with the operational amplifier sharing technique, the sampling capacitors Cs1, Cf1 and Cs2 and Cf2 in the local A/D converters of the n and (n+1) stages sharing the operational amplifier (op amp) are identical, and the outputs of the local A/D of the (n+1) stage sharing the operational amplifier (op amp) are amplified as is at the same polarity. Therefore, the error voltage (Verr) is amplified twice by the n and (n+1) stages. An output Vres(n) of the local A/D of the n stage is the result of adding an error voltage Verr(n) such as an offset to the difference between doubled input voltage 2×Vin and reference voltage D(n)Vref decided by the output of the sub A/D [Vres(n)=2×Vin−D(n)Vref+Verr(n)], and the output Vres(n) of the local A/D of the (n+1) stage is the result of adding an error voltage Verr(n+1) such as an offset to the difference between output Vres(n)×2 of the n stage and reference voltage D(n+1)Vref decided by the output of the sub A/D [Vres(n+1)=2×Vres(n)−D(n+1)Vref+Verr(n+1)]. If Verr(n)=Verr(n+1)=Verr holds, then the output Vres(n) of the local A/D of the (n+1) stage contains 3×Verr as the error voltage.

In accordance with the present invention, there is provided a pipeline A/D converting circuit in which a sampling capacitor of n stage is divided into a plurality of sampling capacitors and some of divided sampling capacitors are used as sampling capacitors for a local A/D of an (n+1) stage during a period of operational amplification by a local A/D of the n stage. The function of the local A/D of the (n+1) stage is implemented with a capacitance smaller than that of the n stage, and a voltage error produced by the local A/D of the (n+1) stage is cancelled.

More specifically, according to one aspect of the present invention, there is provided a pipeline A/D converting circuit including one stage and a stage succeeding said one stage, wherein each stage comprises: a sampling capacitor that samples input signal voltage from a preceding stage; a sub analog-to-digital converting circuit that converts the input signal voltage from the preceding stage to a digital signal; and a sub digital-to-analog converter that selects a reference voltage corresponding to the digital signal output from said sub analog-to-digital converter; and an amplifier, for which the sampling capacitor that has sampled the input signal voltage is connected as a feedback capacitor in an operational amplification time period, in which said amplifier amplifies a difference voltage between the sampled voltage of said input signal and reference voltage, wherein the amplifier is shared by said one stage and said succeeding stage. The sampling capacitor of said one stage are divided into a plurality of sampling capacitors, and some of the plurality of divided sampling capacitors in said one stage are adopted as sampling capacitors of said succeeding stage.

In the pipeline analog-to-digital converting circuit according to the present invention, some of the plurality of divided sampling capacitors in the one stage are used as sampling capacitors of the succeeding stage during operational amplification by the amplifier.

In the one stage of the pipeline analog-to-digital converting circuit according to the present invention, during the time period of calculation and amplification, output voltage of the amplifier is sampled in some of the sampling capacitors of the one stage as the output voltage from the one stage, with an input terminal of the amplifier serving as a reference, and some of the sampling capacitors of the one stage for sampling the output voltage of the amplifier are used as sampling capacitors in the succeeding stage for sampling the output voltage from the one stage; next, a reference voltage selected based upon result of converting the output voltage of the amplifier to a digital signal by the sub analog-to-digital converter of the succeeding stage is applied to at least a first end of at least one capacitor of sampling capacitors of the one stage that have sampled the output voltage of the amplifier, a second end of this capacitor is connected the input terminal of the amplifier, at least one other capacitor among the sampling capacitors of the one stage that have sampled the output voltage of the amplifier is connected as a feedback capacitor between an output terminal and the input terminal of the amplifier, a difference voltage between the output voltage from the one stage and the reference voltage is amplified by the amplifier and the output voltage of the amplifier is output as the output voltage of the succeeding stage.

According to another aspect of the present invention, the foregoing object is attained by providing a pipeline analog-to-digital converting circuit having N stages (where N is a prescribed positive integer) each of which includes a local analog-to-digital converting circuit; wherein juxtaposed first and second circuit blocks each including first to fourth capacitors for sampling and a sub digital-to-analog converter, a single amplifier used conjointly by the first and second circuit blocks and first and second sub analog-to-digital converters are provided as the local analog-to-digital converting circuits of a k stage and (k+1) stage (where k is an integer greater than or equal to 1 and less than or equal to N−2); a time period in which an analog-to-digital converting operation is performed by the k stage and (k+1) stage is assigned alternately to the first circuit block and the second circuit block, the time period comprising a first half and a second half, the first half being a period in which the first and second capacitors that have sampled in common an input signal from the preceding stage are connected in parallel between the output terminal and input terminal of the amplifier, a reference voltage selected by the sub digital-to-analog converter based upon a digital signal that is the result of subjecting the input signal to an analog-to-digital conversion by the first sub analog-to-digital converter is connected to first commonly connected ends of the third and fourth capacitors that have sampled the input signal in common with the first and second capacitors, commonly connected second ends of the third and fourth capacitors are connected to the input terminal of the amplifier and operational amplification is performed in the k stage, and the second half being a period in which the third and fourth capacitors, which have been connected between the reference voltage and the input terminal of the amplifier, are placed in a state isolated from the input terminal of the amplifier, the input signal from the preceding stage and the reference voltage, a first end of one of the first capacitor and second capacitor is disconnected from the output terminal of the amplifier and is connected to a reference voltage selected by the sub digital-to-analog converter based upon a digital signal that is the result of subjecting the output voltage of the amplifier to an analog-to-digital conversion by the second sub analog-to-digital converter, and operational amplification is performed in the (k−1) stage; and in a time period in which one circuit block of the first and second circuit blocks is performing the analog-to-digital conversion operation in the k stage and (k+1) stage, the other circuit block of the first and second circuit blocks samples the input signal from the preceding stage in common in a plurality of capacitors of the other circuit block.

The meritorious effects of the present invention are summarized as follows.

In accordance with the present invention, a sampling capacitor of n stage is divided into a plurality of sampling capacitors and some of divided sampling capacitors are used as sampling capacitors of an (n+1) stage, and the capacitive load of the (n+1) stage is no longer the same as that of the n stage. Since the capacitance value of the (n+1) stage is reduced, it is possible to achieve a reduction in power consumption.

Furthermore, in accordance with the present invention, computation error voltage in the (n+1) stage can be cancelled by storing it in the sampling capacitors of the (n+1) stage as voltage across input and output terminals of an operational amplifier during the time period of operational amplification in the n stage. As a result, in accordance with the present invention, computation error in the (n+1) stage can be reduced without interchanging the polarities between the input and output terminals as in the prior art.

Other features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

PREFERRED MODES OF THE INVENTION

Figure 1:
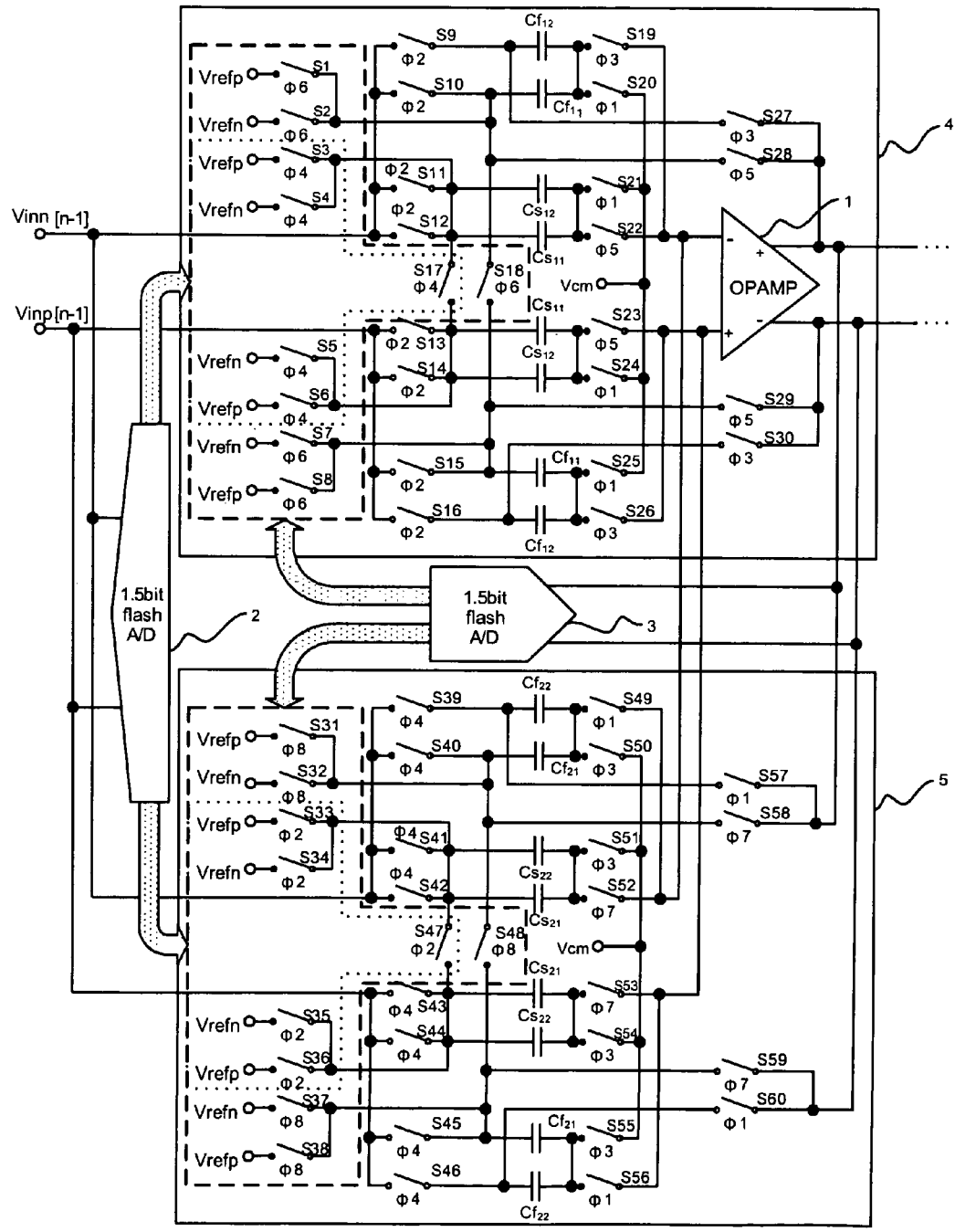
FIG. 1 is a diagram illustrating the structure of an embodiment of the present invention.

The present invention will be described in greater detail with reference to the accompanying drawings. In accordance with the present invention, there is provided a pipeline analog-to-digital converting circuit in which one stage and a stage succeeding the one stage each have a sampling capacitor for sampling input signal voltage from a preceding stage, a sub analog-to-digital converting circuit for converting the input signal voltage from the preceding stage to a digital signal, and a sub digital-to-analog converter for selecting a reference voltage that corresponds to the digital signal from the sub analog-to-digital converter, and an amplifier for amplifying a difference voltage between a sampled voltage and the reference voltage wherein a sampling capacitor that has sampled the input signal voltage is connected as a feedback capacitor in an operational amplification time period.

The amplifier is shared by the one stage and the succeeding stage. The sampling capacitor of the one stage is divided into a plurality of sampling capacitors, and some of the divided sampling capacitors in the one stage are used as sampling capacitors of the succeeding stage. In the present invention, the plurality of divided sampling capacitors in the one stage are interleave-controlled, and some of the plurality of divided sampling capacitors in the one stage are used as sampling capacitors of the succeeding stage during the time period of operational amplification by the amplifier in the one stage.

In the present invention, during the operational amplification time period, output voltage of the amplifier is sampled in some of the sampling capacitors of the one stage, with an input terminal (imaginary ground point) of the amplifier serving as a reference, and some of the sampling capacitors of the one stage for sampling the output voltage of the amplifier are used as sampling capacitors in the succeeding stage for sampling the signal voltage from the one stage. A reference voltage selected based upon result of converting the output voltage of the amplifier to a digital signal by the sub analog-to-digital converter of the succeeding stage is applied to at least a first end of at least one capacitor of sampling capacitors of the one stage that have sampled the output voltage of the amplifier, a second end of this capacitor is connected to the input terminal of the amplifier, at least one other capacitor among the sampling capacitors of the one stage that have sampled the output voltage of the amplifier is connected as a feedback capacitor between the output terminal and the input terminal of the amplifier, and a difference voltage between the sampled signal voltage from the one stage and the reference voltage is amplified by the amplifier.

In an example of the present invention, there is provided a pipeline A/D converting circuit having N stages (where N is a prescribed positive integer), each of which includes a local analog-to-digital (A/D) converting circuit, in which a first circuit block (4) and a second circuit block (5) and a circuit having a first sub A/D converter (2) and a second sub A/D converter (3) are provided as the local A/D converting circuits of a k stage and (k+1) stage (where k is an integer greater than or equal to 1 and less than or equal to N−2).

The first circuit block (4) includes a sub digital-to-analog (D/A) converter for selecting a reference voltage terminal (Vrefn, Vrefp) based upon the output of the first sub A/D converter (2) or second sub A/D converter (3), an amplifier (1), first and second capacitors (Cf11, Cf12) that function as sampling capacitors and feedback capacitors, and third and fourth capacitors (Cs11, Cs12) that function as sampling capacitors and capacitors for storing reference voltage. The second circuit block (5) includes a sub D/A converter for selecting a reference voltage terminal (Vrefn, Vrefp) based upon the output of the first sub A/D converter (2) or second sub A/D converter (3), first and second capacitors (Cf21, Cf22) that function as sampling capacitors and feedback capacitors, and third and fourth capacitors (Cs21, Cs22) that function as sampling capacitors and capacitors for storing reference voltage. The connections of these circuits will now be described.

In the first block (4) in a time period (1), first ends of the first and second capacitors (Cf11, Cf12) and first ends of the third and fourth capacitors (Cs11, Cs12) are connected in common to an input terminal for receiving a signal from the preceding stage, and second ends of the first and second capacitors (Cf11, Cf12) and second terminals of the third and fourth capacitors (Cs11, Cs12) are connected in common to an common-mode voltage terminal (Vcm).

In the first block (4) in the next time period (2'), first ends of the first and second capacitors (Cf11, Cf12) are connected in common to the output terminal of the amplifier (1), second ends of the first and second capacitors (Cf11, Cf12) are connected in common to the input terminal of the amplifier, first ends of the third and fourth capacitors (Cs11, Cs12) are connected in common to a reference voltage terminal (selected by the output of the sub A/D converter) that corresponds to the digital signal output of the first sub A/D converter (2), and second ends of the third and fourth capacitors (Cs11, Cs12) are connected in common to second ends of the first and second capacitors (Cf11, Cf12) and to the input terminal of the amplifier (1). Operational amplification is carried out.

In the second block (5) in the time period (2'), first ends of the first and second capacitors (Cf21, Cf22) and first ends of the third and fourth capacitors (Cs21, Cs22) are connected in common to the input terminal for receiving the signal from the preceding stage, and second ends of the first and second capacitors (Cf21, Cf22) and second ends of third and fourth capacitors (Cs21, Cs22) are connected in common to the common-mode voltage terminal (Vcm).

In the first block (4) in the time period (2"), the third and fourth capacitors (Cs11, Cs12) are disconnected from the amplifier (1), the output voltage of the amplifier (1) is converted to a digital signal by the second sub A/D converter (3), the first end of the second capacitor (Cf12) is connected to the output terminal of the amplifier (1), the first end of the first capacitor (Cf11) is connected to a reference voltage terminal (selected by the output of the sub D/A converter) that corresponds to the digital signal output of the second sub A/D converter (3), the second ends of the first and second capacitors (Cf11, Cf12) are connected in common to the input terminal of the amplifier (1), and operational amplification is carried out. In time period (2"), the second circuit block (5) is held in a state identical with that of time period (2').

In the first block (4) in the next time period (3'), the first ends of the first and second capacitors (Cf11, Cf12) and the first ends of the third and fourth capacitors (Cs11, Cs12) are connected in common to the input terminal for receiving the signal from the preceding stage, and the second ends of the first and second capacitors (Cf11, Cf12) and the second ends of the third and fourth capacitors (Cs11, Cs12) are connected in common to the common-mode voltage terminal (Vcm).

Further, in time period (3'), the second circuit block (5) performs an operation similar to that in time period (2') relating to the first circuit block (4). That is, the first ends of the first and second capacitors (Cf21, Cf22) are connected in common to the output terminal of the amplifier (1), the second ends of the first and second capacitors (Cf21, Cf22) are connected in common to the input terminal of the amplifier, first ends of the third and fourth capacitors (Cs21, Cs22) are connected in common to a reference voltage terminal that corresponds to the digital signal output of the first sub A/D converter (2), and second ends of the third and fourth capacitors (Cs21, Cs22) are connected in common to second ends of the first and second capacitors (Cf21, Cf22) and to an input terminal of the amplifier (1). Operational amplification is carried out.

In time period (3"), the first circuit block (4) is held in the same state as that of time period (3'), and the second circuit block (5) performs an operation similar to that of the time period (2") relating to the first circuit block and performs amplification with respect to the amplifier output that has accumulated in the first and second capacitors (Cf21, Cf22) in time period (3').

The series of operations in time periods (2'), (2"), (3'), (3") are repeated one after another with these four time periods serving as one unit, whereby the local A/D conversions of the k stage and (k+1) stage are performed in pipelined fashion. The time interval of time periods (2')+(2") is the same as the time interval of time periods (3')+(3"). An interleaved operation is carried out. That is, in time periods (2')+(2"), while the first circuit block (4) is performing the local A/D conversion operations of the k stage and (k+1) stage, the second circuit block (5) samples the input signal voltage from the preceding stage, and in time periods (3')+(3"), while the second circuit block (5) is performing the local A/D conversion operations of the k stage and (k+1) stage, the first circuit block (4) samples the input signal voltage from the preceding stage.

In an example of the present invention, the amplifier (1) comprises a differential-input, differential-output operational amplifier (op amp) having inverting and non-inverting input terminals and inverting and non-inverting output terminals, and a set of the first and second capacitors and third and fourth capacitors is provided for the inverting input terminal and for the non-inverting input terminal.

As described above, the present invention is such that some of the sampling capacitors of the n stage are used as sampling capacitors for the local A/D of the (n+1) stage in the time period of operational amplification in the local A/D of the n stage. The function of the local A/D of the (n+1) stage is implemented with a sampling capacitance smaller than that of the n stage, and a voltage error produced by the local A/D of the (n+1) stage is cancelled. In accordance with the present invention, by using some of the plurality of divided sampling capacitors in the n stage as sampling capacitors for the local A/D of the (n+1) stage in the time period of operational amplification in the local A/D of the n stage, it is possible to cancel the computation error voltage and reduce sampling capacitance in the local A/D of the (n+1) stage.

Furthermore, in accordance with the present invention, the arrangement is such that some of the plurality of divided sampling capacitors in the n stage are used as sampling capacitors for the local A/D in the (n+1) stage. As a result, the capacitive load of the (n+1) stage is no longer the same as that of the n stage. Since the capacitance value is reduced in the (n+1) stage, it is possible to achieve a reduction in power consumption. Further, by reducing the capacitive load, it is possible to obtain a faster response characteristic for the amplifier.

In accordance with the present invention, the computation error voltage in the local A/D of the (n+1) stage can be cancelled by storing it in the sampling capacitors of the (n+1) stage as voltage across input and output terminals of an operational amplifier in the operational amplification time period of the n stage. As a result, computation error voltage in the (n+1) stage can be reduced without interchanging the polarities between the input and output terminals as in the prior art (FSPI of Non-Patent Document 1).

FIG. 1 is a diagram illustrating the structure of a first example of the present invention. As shown in FIG. 1, the A/D converting circuit according to this example includes circuit blocks 4, 5 that perform an interleaved operation, a sub A/D (1.5-bit flash A/D) 2 for subjecting a differential voltage between signal input terminals Vinn[n−1] and Ninp[n−1] to an A/D conversion in 1.5 bits, and a sub A/D (1.5-bit flash A/D) 3 for subjecting a voltage difference, which is produced across output terminals of an operational amplifier (op amp) 1, to an A/D conversion in 1.5 bits.

The circuit block 4 includes:

(A1) the operational amplifier (op amp) 1;

(A2) a switch S19 for controlling connection and disconnection between commonly connected first terminals of capacitors Cf11 and Cf12 of a first set and an inverting input terminal (−) of the operational amplifier (op amp) 1;

(A3) a switch S20 for controlling connection and disconnection between the commonly connected first terminals of capacitors Cf11 and Cf12 of the first set and a common-mode voltage terminal Vcm;

(A4) a switch S22 for controlling connection and disconnection between commonly connected first terminals of capacitors Cs11 and Cs12 of a second set and the inverting input terminal (−) of the operational amplifier (op amp) 1;

(A5) a switch S21 for controlling connection and disconnection between the commonly connected first terminals of the capacitors Cs11 and Cs12 of the second set and the common-mode voltage terminal Vcm;

(A6) a switch S23 for controlling connection and disconnection between commonly connected first terminals of capacitors Cs11 and Cs12 of a third set and a non-inverting input terminal (+) of the operational amplifier (op amp) 1;

(A7) a switch S24 for controlling connection and disconnection between the commonly connected first terminals of capacitors Cs11 and Cs12 of the third set and the common-mode voltage terminal Vcm;

(A8) a switch S26 for controlling connection and disconnection between commonly connected first terminals of capacitors Cf11 and Cf12 of a fourth set and the non-inverting input terminal (+) of the operational amplifier (op amp) 1;

(A9) a switch S25 for controlling connection and disconnection between the commonly connected first terminals of the capacitors Cf11 and Cf12 of the fourth set and the common-mode voltage terminal Vcm;

(A10) switches S9 and S10 for controlling connection and disconnection between second terminals of the capacitors Cf11 and Cf12 of the first set and an inverted-signal input terminal Vinn[n−1];

(A11) switches S11 and S12 for controlling connection and disconnection between the commonly connected second terminals of the capacitors Cs11 and Cs12 of the second set and the inverted-signal input terminal Vinn[n−1];

(A12) switches S13 and S14 for controlling connection and disconnection between second terminals of the capacitors Cs11 and Cs12 of the third set and a non-inverted-signal input terminal Vinp[n−1];

(A13) switches S15 and S16 for controlling connection and disconnection between second terminals of the capacitors Cf11 and Cf12 of the fourth set and the non-inverted-signal input terminal Vinp[n−1];

(A14) a switch S17 for controlling connection and disconnection between the commonly connected second terminals of the capacitors Cs11 and Cs12 of the second set and the commonly connected second terminals of the capacitors Cs11 and Cs12 of the third set;

(A15) a switch S18 for controlling connection and disconnection between the second terminal of the capacitor Cf11 of the first set and the second terminal of the capacitor Cf11 of the fourth set;

(A16) switches S27 and S28 for controlling connection and disconnection between the second terminals of the capacitors Cf12, Cf11, respectively, of the first set and a non-inverting output terminal (+) of the operational amplifier (op amp) 1;

(A17) switches S29 and S30 for controlling connection and disconnection between the second terminals of the capacitors Cf12, Cf11, respectively, of the fourth set and an inverting output terminal (−) of the operational amplifier (op amp) 1;

(A18) switches S1 and S2 for controlling connection and disconnection between the second terminal of the capacitor Cf11 of the first set and reference voltage terminals Vrefp and Vrefn;

(A19) switches S3 and S4 for controlling connection and disconnection between the commonly connected second terminals of the capacitors Cs11 and Cs12 of the second set and reference voltage terminals Vrefp and Vrefn;

(A20) switches S5 and S6 for controlling connection and disconnection between the commonly connected second terminals of the capacitors Cs11 and Cs12 of the third set and reference voltage terminals Vrefn and Vrefp; and (A21) switches S7 and S8 for controlling connection and disconnection between the second terminal of the capacitor Cf11 of the fourth set and reference voltage terminals Vrefn and Vrefp.

The circuit block 4 includes:

(B1) a switch S49 for controlling connection and disconnection between commonly connected first terminals of capacitors Cf21 and Cf22 of a first set and the inverting input terminal (−) of the operational amplifier (op amp) 1;

(B2) a switch S50 for controlling connection and disconnection between the commonly connected first terminals of capacitors Cf21 and Cf22 of the first set and a common-mode voltage terminal Vcm;

(B3) a switch S52 for controlling connection and disconnection between commonly connected first terminals of capacitors Cs21 and Cs22 of a second set and the inverting input terminal (−) of the operational amplifier (op amp) 1;

(B4) a switch S51 for controlling connection and disconnection between the commonly connected first terminals of the capacitors Cs21 and Cs22 of the second set and the common-mode voltage terminal Vcm;

(B5) a switch S53 for controlling connection and disconnection between commonly connected first terminals of capacitors Cs21 and Cs22 of a third set and the non-inverting input terminal (+) of the operational amplifier (op amp) 1;

(B6) a switch S54 for controlling connection and disconnection between the commonly connected first terminals of capacitors Cs1 and Cs12 of the third set and the common-mode voltage terminal Vcm;

(B7) a switch S56 for controlling connection and disconnection between commonly connected first terminals of capacitors Cf21 and Cf22 of a fourth set and the non-inverting input terminal (+) of the operational amplifier (op amp) 1;

(B8) a switch S55 for controlling connection and disconnection between the commonly connected first terminals of the capacitors Cf21 and Cf22 of the fourth set and the common-mode voltage terminal Vcm;

(B9) switches S39, S40 for controlling connection and disconnection between second terminals of the capacitors Cf21 and Cf22 of the first set and inverted-signal input terminal Vinn[n−1];

(B10) switches S41 and S42 for controlling connection and disconnection between the commonly connected second terminals of the capacitors Cs21 and Cs22 of the second set and the inverted-signal input terminal Vinn[n−1];

(B11) switches S43 and S44 for controlling connection and disconnection between second terminals of the capacitors Cs21 and Cs22 of the third set and non-inverted-signal input terminal Vinp[n−1];

(B12) switches S45 and S46 for controlling connection and disconnection between second terminals of the capacitors Cf21 and Cf22 of the fourth set and the non-inverted-signal input terminal Vinp[n−1];

(B13) a switch S47 for controlling connection and disconnection between the commonly connected second terminals of the capacitors Cs21 and Cs22 of the second set and the commonly connected second terminals of the capacitors Cs21 and Cs22 of the third set;

(B14) a switch S48 for controlling connection and disconnection between the second terminal of the capacitor Cf21 of the first set and the second terminal of the capacitor Cf21 of the fourth set;

(B15) switches S57 and S58 for controlling connection and disconnection between the second terminals of the capacitors Cf22 and Cf21, respectively, of the first set and the non-inverting output terminal (+) of the operational amplifier (op amp) 1;

(B16) switches S59 and S60 for controlling connection and disconnection between the second terminals of the capacitors Cf22 and Cf21, respectively, of the fourth set and the inverting output terminal (−) of the operational amplifier (op amp) 1;

(B17) switches S31 and S32 for controlling connection and disconnection between the second terminal of the capacitor Cf21 of the first set and reference voltage terminals Vrefp and Vrefn;

(B18) switches S33 and S34 for controlling connection and disconnection between the commonly connected second terminals of the capacitors Cs21 and Cs22 of the second set and reference voltage terminals Vrefp and Vrefn;

(B19) switches S35 and S36 for controlling connection and disconnection between the commonly connected second terminals of the capacitors Cs21 and Cs22 of the third set and reference voltage terminals Vrefn and Vrefp; and (B20) switches S37 and S38 for controlling connection and disconnection between the second terminal of the capacitor Cf21 of the fourth set and reference voltage terminals Vrefn and Vrefp.

In the circuit block 4, the switches S20, S21, S24 and S25 are on/off controlled in common by control signal $\phi1$.

Switches S9, S10, S11, S12, S13, S14, S15 and S16 are on/off controlled in common by control signal $\phi2$.

Switches S19, S26, S27, S30 are on/off controlled in common by control signal $\phi3$.

Switches S3, S4, S5, S6 and S17 are on/off controlled selectively by control signal $\phi4$ in accordance with the result that is output from the sub A/D 2.

Switches S22, S23, S28 and S29 are on/off controlled in common by control signal $\phi5$.

Switches S1, S2, S7, S8 and S18 are on/off controlled selectively by control signal $\phi6$ in accordance with the result that is output from the sub A/D 3.

In the circuit block 5, the switches S49, S56, S57 and S60 are on/off controlled in common by control signal $\phi1$.

Switches S33, S34, S35, S36 and S47 are on/off controlled selectively by control signal $\phi2$ in accordance with the result that is output from the sub A/D 2.

Switches S50, S51, S54 and S55 are on/off controlled in common by control signal $\phi3$.

Switches S39, S40, S41, S42, S43, S44, S45 and S46 are on/off controlled in common by control signal $\phi4$.

Switches S52, S53, S58 and S59 are opened and closed by control signal $\phi7$.

Switches S31, S32, S37, S38 and S48 are on/off controlled selectively by control signal $\phi8$ in accordance with the result that is output from the sub A/D 3.

The circuit block 5 shares the operational amplifier (op amp) 1 with the circuit block 4. Connections of the capacitors and switches other than the connections to the operational amplifier (op amp) 1 are the same as those of the circuit block 4.

The switches S3, S4, S5, S6 and S17 of the circuit block 4 and the switches S33, S34, S35, S36 and S47 are interleave-controlled in accordance with the result of the output from the sub A/D 2.

The switches S1, S2, S7, S8 and S18 of the circuit block 4 and the switches S31, S32, S37, S38 and S48 are interleave-controlled in accordance with the result of the output from the sub A/D 3.

Figure 2:
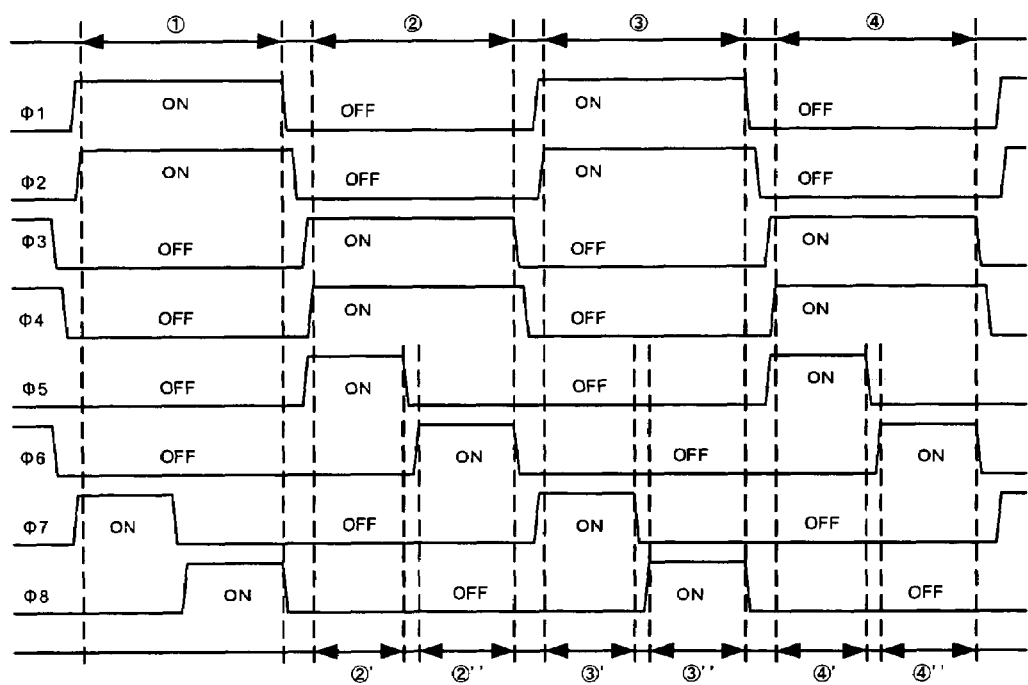
FIG. 2 is a diagram illustrating timing waveforms of control signals according to the embodiment of the present invention.

FIG. 2 is a timing diagram useful in describing the operation of this example shown in FIG. 1. This illustrates an example of the timing waveforms of control signals $\phi1$ to $\phi8$.

Figure 3:
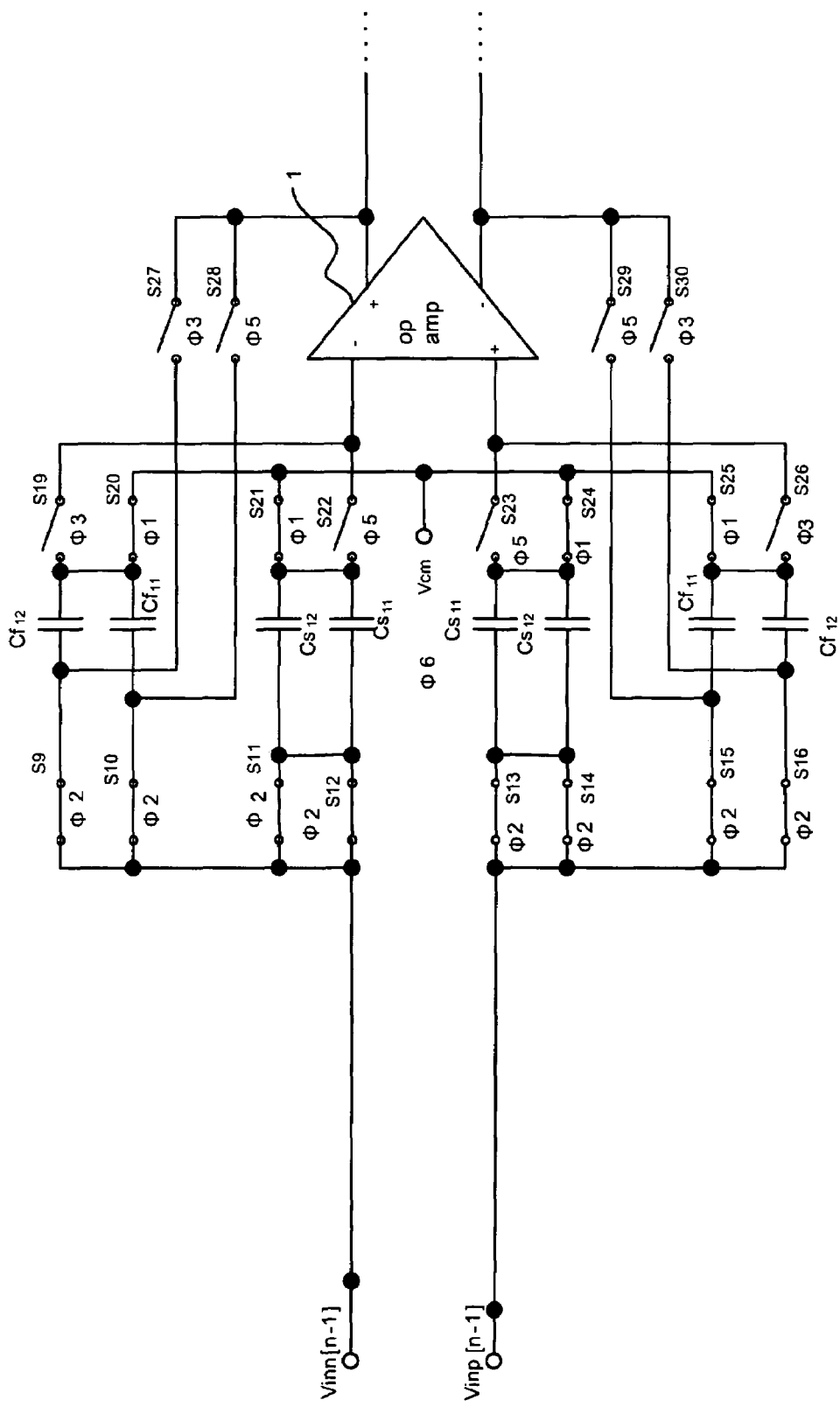
FIG. 3 is a diagram useful in describing the circuit operation of the embodiment.
Figure 4:
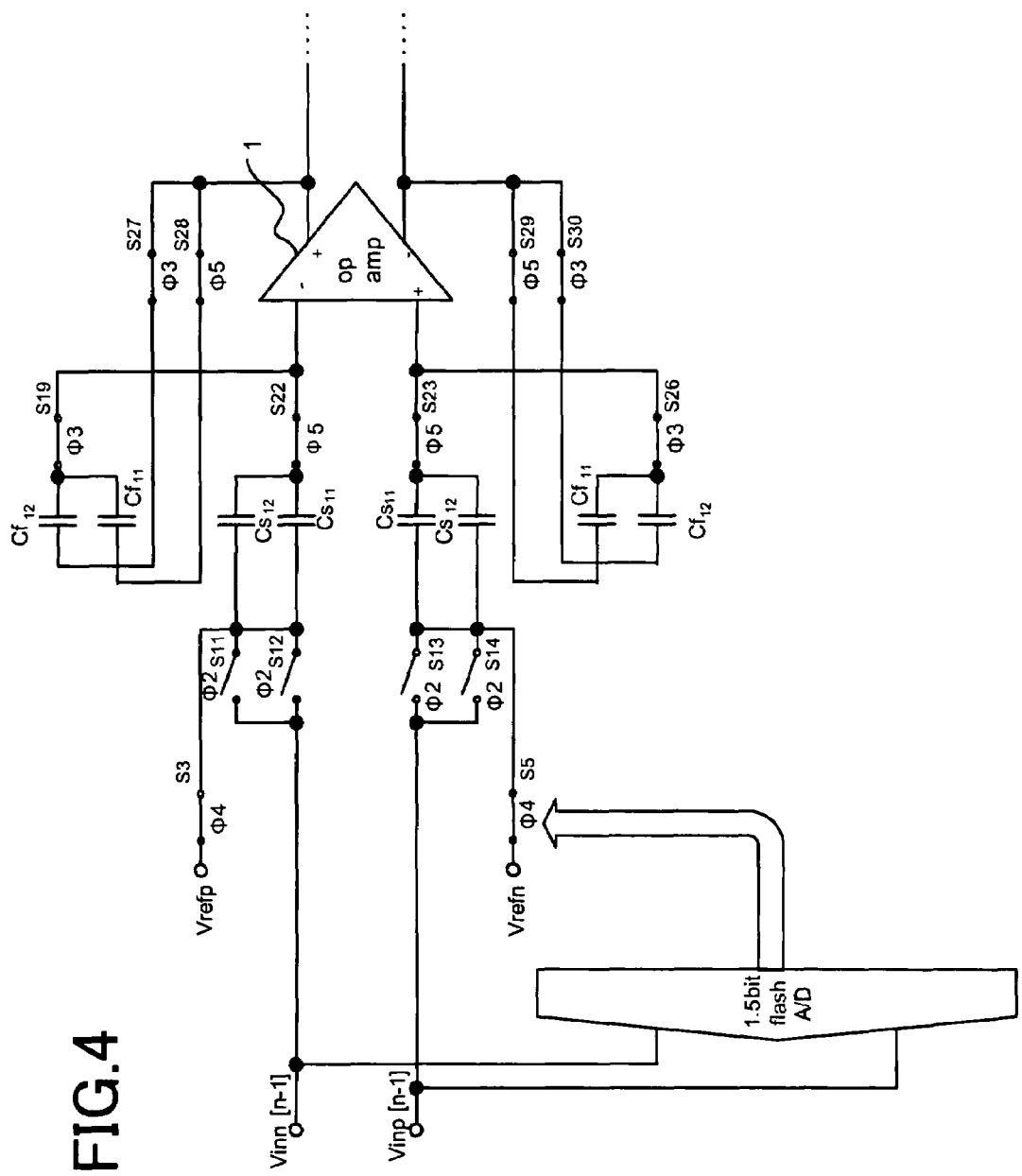
FIG. 4 is a diagram useful in describing the circuit operation of the embodiment.
Figure 5:
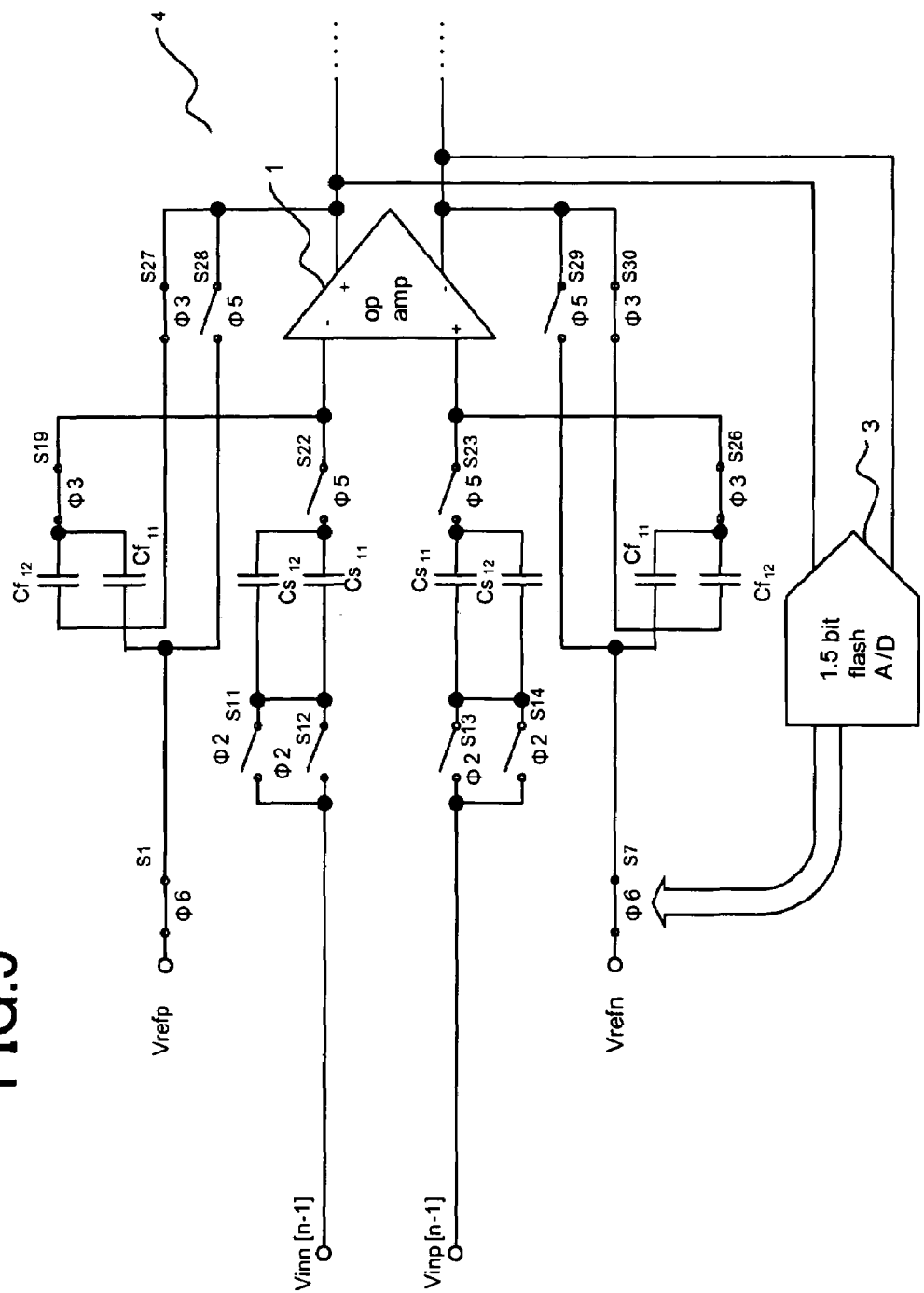
FIG. 5 is a diagram useful in describing the circuit operation of the embodiment.

FIGS. 3, 4 and 5 are diagrams illustrating, in an extracted manner, the connections formed in the circuit of FIG. 2 in time periods 1, 2' and 3", respectively.

First, in the circuit block 4 of the n stage in time period 1, first terminals of the divided capacitors Cs11, Cs12, Cf11 and Cf12 are connected to the differential signal input terminals Vinn[n−1], Vinp[n−1], and sampling is performed. Second terminals of the capacitors Cs11, Cs12, Cf11 and Cf12 are connected to common-mode voltage terminal Vcm. In time period 1 in FIG. 2, control signals $\phi1$ and $\phi2$ go HIGH, control signals $\phi3$, $\phi4$ and $\phi5$ go LOW, control signal $\phi7$ goes HIGH in the first half of this time period, and control signal $\phi8$ goes HIGH in the second half.

In the circuit block 4 in FIG. 3 in time period 1, the switches S20, S21, S24 and S25 driven by $\phi1$ are turned on, and first terminals of capacitors Cf11 and Cf12 of the first set, capacitors Cs11 and Cs12 of the second set, capacitors Cs11 and Cs12 of the third set and capacitors Cf11 and Cf12 of the fourth set are all connected to the common-mode voltage terminal Vcm. The switches S9, S10, S11, S12, S13, S14, S15 and S16 driven by $\phi2$ are turned on, second terminals of the capacitors Cf11 and Cf12 of the first set and of the capacitors Cs11 and Cs12 of the second set are connected to the inverted-signal input terminal Vinn[n−1], and second terminals of the capacitors Cs11 and Cs12 of the third set and of the capacitors Cf11 and Cf12 of the fourth set are connected to the non-inverted-signal input terminal Vinp[n−1]. Switches S19, S26, S27 and S30 driven by $\phi3$, switches S3, S4, S5, S6 and S17 driven by $\phi4$, switches S22, S23, S28 and S29 driven by $\phi5$, and switches S1, S2, S7, S8 and S18 driven by $\phi6$ are turned off for the duration of time period 1, so that both terminals of each of these switches are in a state in which they are disconnected from each other. The connections of the circuit block 4 in time period 1 form a sampling circuit in which the signals that enter the inverted-signal input terminal Vinn[n−1] and non-inverted-signal input terminal Vinp[n−1] from the local A/D of the (n−1) stage are sampled in the capacitors.

For the duration of time period 1, the circuit block 4 is disconnected from the operational amplifier (op amp) 1 and the operational amplifying function is not performed (this is the idle state).

Meanwhile, in the circuit block 5 in time period 1, the switches S49 and S56 driven by $\phi1$ attain the ON stage, and first terminals of the capacitors Cf21 and Cf22 of the first and fourth sets are connected to the inverting input terminal (−) and non-inverting input terminal (+) of the operational amplifier (op amp) 1. In time period 1, the switches S57 and S60 connect the non-inverting output terminal (+) of the operational amplifier (op amp) 1 with the second terminal of the capacitor Cf22 of the first set and inverting output terminal (−) of the operational amplifier (op amp) 1 with the second terminal of the capacitor Cf22 of the fourth set. By virtue of these conditions, the circuit block 5 constructs an operational amplifying circuit in which the capacitors Cf21 and Cf22 are feedback-connected to the operational amplifier (op amp) 1, and performs the operational amplifying operation.

Next, in the local A/D (circuit block 4) of the n stage in time period 2', the capacitors Cf11 and Cf12 are inserted in parallel in the feedback paths (between the non-inverting output terminal and inverting input terminal and between the inverting output terminal and non-inverting input terminal) of the operational amplifier (op amp) 1. Further, the differential voltage between the differential signal input terminals Vinn[n−1] and Vinp[n−1] is converted to a digital signal, and the second terminals of the capacitors Cs11 and Cs12 are connected to respective reference voltages via the switches S3, S4, S5 and S6 controlled by φ4, whereby the operational amplifying operation is performed. The capacitors Cf11 and Cf12 are connected between the input and output terminals of the operational amplifier (op amp) 1 and function as capacitors for sampling the output of the operational amplifier (op amp) 1.

In time period 2', φ1 and φ2 are go LOW, φ3, φ4 and φ5 go HIGH, and φ6, φ7 and φ8 go LOW. In the circuit block 4, as shown in FIG. 4, switches S20, S21, S24 and S25 driven by φ1 attain the OFF state, first terminals of the capacitors Cf11 and Cf12 of the first and fourth sets and first terminals of the capacitors Cs11 and Cs12 of the second and third sets are disconnected from the common-mode voltage terminal Vcm. The switches S9, S10, S11, S12, S13, S14, S15 and S16 driven by φ2 also attain the OFF state, the second terminals of capacitors Cf11 and Cf12 of the first set and of capacitors Cs11 and Cs12 of the second set are disconnected from the inverted-signal input terminal Vinn[n−1], and second terminals of the capacitors Cs11 and Cs12 of the third set and of the capacitors Cf11 and Cf12 of the fourth set are disconnected from the non-inverted-signal input terminal Vinp[n−1]. Switches S19, S26, S27 and S30 driven by φ3 and switches S22, S23, S28 and S29 driven by φ5 attain the ON state, commonly connected first terminals of the capacitors Cf11 and Cf12 of the first set and commonly connected first terminals of the capacitors Cs11 and Cs12 of the second set are connected to the inverting input terminal (−) of the operational amplifier (op amp) 1, commonly connected first terminals of the capacitors Cs11 and Cs12 of the third set and commonly connected first terminals of the capacitors Cf11 and Cf12 of the fourth set are connected to the non-inverting input terminal (+) of the operational amplifier (op amp) 1. Second terminals of the capacitors Cf11 and Cf12 of the first set are connected to the non-inverting output terminal (+) of the operational amplifier (op amp) 1, and second terminals of the capacitors Cf11 and Cf12 of the fourth set are connected to the non-inverting output terminal (+) of the operational amplifier (op amp) 1.

Furthermore, any of the switches S3 and S5, switches S4 and S6 and switch S17 driven selectively by φ4 is turned on in accordance with the output result from the sub A/D 2, and either the second terminals of the capacitors Cs11 and Cs12 of the second set and second terminals of the capacitors Cs11 and Cs12 of the third set are connected to reference voltage terminal Vrefp or Vrefn, or both ends of the switch 17 are short-circuited.

In the connections made above, the circuit block 4 forms an operational amplifying circuit in which the parallel capacitors Cf11 and Cf12 are provided in the feedback path of the operational amplifier (op amp) 1, and performs calculation (calculation of the residual) and amplification.

Meanwhile, in the circuit block 5 in time period 2', the switches S49, S56, S57 and S60 driven by φ1 and the switches S52, S53, S58 and S59 driven by φ7 are set in the OFF state and are disconnected from the operational amplifier (op amp) 1. The switches S50, S51, S54 and S55 driven by φ3 and the switches S39, S40, S41, S42, S43, S44, S45 and S46 driven by φ4 attain the ON state. Switches S33, S34, S35, S36 and S37 driven by φ2 and switches S31, S32, S37, S38 and S48 driven by φ8 are in the OFF state. The circuit block 5 forms connections that make it possible to sample the input from the (n−1) stage. That is, the second ends of the capacitors Cf21 and Cf22 of the first set and of the capacitors Cs21 and Cs22 of the second set are connected to the inverted-signal input terminal Vinn[n−1], the second ends of the capacitors Cs21 and Cs22 of the third set and of the capacitors Cf21 and Cf22 of the fourth set are connected to the non-inverted-signal input terminal Vinp[n−1], and the commonly connected first terminals of the capacitors Cf21 and Cf22 of the first set, commonly connected first terminals of the capacitors Cs21 and Cs22 of the second set, commonly connected first terminals of the capacitors Cs21 and Cs22 of the third set and commonly connected first terminals of the capacitors Cf21 and Cf22 of the fourth set are connected to the common-mode voltage terminal Vcm.

In time period 2' in which the above-described connections are formed, with regard particularly to capacitors Cf11 and Cf12 of circuit block 4, the capacitors Cf11 and Cf12 of the first set are connected in parallel with each other between the non-inverting output terminal (+) and inverting input terminal (−) of the operational amplifier (op amp) 1, and the capacitors Cf11 and Cf12 of the fourth set are connected in parallel with each other between the inverting output terminal (−) and non-inverting input terminal (+) of the operational amplifier (op amp) 1. This is equivalent to storing the voltage difference produced between the input and output terminals of the operational amplifier (op amp) 1, which is the virtual ground point, in the capacitors. That is, the capacitors Cf11 and Cf12 of the circuit block 4 function as capacitors that sample the output of the operational amplifier (op amp) 1 in time period 2'.

Refer now to FIG. 5. In time period 2″, the capacitors Cs11 and Cs12 of circuit block 4 are disconnected from the operational amplifier (op amp), the output of the local A/D of the n stage is converted to a digital signal by the sub A/D (1.5-bit flash A/D) 3, the switches controlled by φ6 are connected to the reference voltages and the operational amplifying operation is performed using the capacitors Cf11 and Cf12. Capacitors Cf11 and Cf12 perform an operational amplifying operation with respect to the output of the operational amplifier (op amp) that was stored in time period 2', and operate as the local A/D of the (n+1) stage.

In time period 2″, φ5 goes LOW and φ6 goes HIGH. In the circuit block 4, switches S22, S23, S28 and S29 driven by φ5 attain the OFF state, capacitors Cs11 and Cs12 of the second and third sets are disconnected from the inverting input terminal (−) and non-inverting input terminal (+), respectively, of the operational amplifier (op amp) 1, and capacitors Cf11 of the first and fourth sets are disconnected from the non-inverting output terminal (+) and inverting output terminal (−), respectively, of the operational amplifier (op amp) 1.

The switches S1, S2, S7, S8 and S18 driven by φ6 are driven selectively in accordance with the output result of the sub A/D 3 with respect to the output during time period 2', any of the switches S1 and S7, switches S2 and S8 and switch S18 is turned on, and either the second terminals of the capacitors Cf11 of the first and fourth sets are connected to the reference voltage terminal Vrefn or Vrefp or both ends of the switch S18 are short-circuited.

As a result, the operational amplifying operation is performed with respect to the output of the operational amplifier (op amp) 1 stored in the capacitors Cf11 and Cf12 of the circuit block 4 during time period 2', and the circuit block 4 operates as the local A/D of the (n+1) stage.

Meanwhile, the circuit block 5 is held is the same state as that in time period 2'.

In circuit block 4 in time period 3', switches S20, S21, S24 and S25 driven by φ1 and switches S9, S10, S11, S12, S13, S14, S15 and S16 driven by φ2 are set in ON state, and switches S19, S26, S27, S30 driven by φ3, switches S3, S4, S5, S6 and S17 driven by φ4, switches S22, S23, S28 and S29 driven by φ5 and switches S1, S2, S7, S8 and S18 driven by φ6 are set in the OFF state in time period 3'.

In the state of these connections, the circuit block 4 is placed in a state in which it is possible to sample the input from the preceding stage in the capacitors Cf11, Cf12, Cs11 and Cs12.

On the other hand, in time period 3', the circuit block 5 performs an operation similar to that of the circuit block 4 in time period 2'. That is, switches S50, S51, S54 and S55 driven by φ3 and switches S39, S40, S41, S42, S43, S44, S45 and S46 driven by φ4 turn off, and switches S49, S56, S57 and S60 driven by φ1 and switches S52, S53, S58 and S59 driven by φ7 turn on, whereby the input and output terminals of the operational amplifier (op amp) are connected. Switches S33, S34, S35, S36 and S47 driven by φ2 are driven selectively in accordance with the result that is output from the sub A/D 2, and any of the switches S33 and S35, switches S34 and S36 and switch S47 is turned on, whereby either the second terminals of the capacitors Cs21 and Cs22 are connected to the reference voltage terminals or both ends of the switch S47 are short-circuited. As a result, with the circuit connections described above, the circuit block 5 constructs an operational amplifying circuit with respect to the operational amplifier (op amp) 1 and performs an operational amplifying operation.

In time period 3', with regard particularly to capacitors Cf21 and Cf22 that construct circuit block 5, the capacitors Cf21 and Cf22 are connected between the input and output terminals of the operational amplifier (op amp) 1. This is equivalent to storing the voltage difference produced between the input and output terminals of the operational amplifier (op amp) 1, which is the virtual ground point, in the capacitors. Accordingly, capacitors Cf21 and Cf22 of the circuit block 5 function as capacitors that sample the output of the operational amplifier (op amp) 1 in time period 3'.

In time period 3", the circuit block 4 is held is the same state as that in time period 3'.

On the other hand, the circuit block 5 performs an operation similar to that of the circuit block 4 in time period 2". That is, switches S52, S53, S58 and S59 driven by φ7 attain the OFF state, capacitors Cs21 and Cs22 are disconnected from the input terminals of the operational amplifier (op amp), and the capacitor Cf21 is disconnected from the output terminal of the operational amplifier (op amp) 1.

Switches S31, S32, S37, S38 and S48 driven by φ8 are driven selectively in accordance with the output result of the sub A/D 3 with respect to the output of the operational amplifier (op amp) 1 during time period 3', any of the switches S31 and S37, switches S32 and S38 and switch S48 is turned on, and either the second terminals of the capacitor Cf21 are connected to the reference voltage terminal or both ends of the switch S48 are short-circuited.

As a result, the circuit connections are such that the operational amplifying operation is performed with respect to the output of the operational amplifier (op amp) 1 that was stored in the capacitors Cf21 and Cf22 during time period 3', and the circuit arrangement operates as the local A/D of the (n+1) stage.

From this point onward the circuit block 4 and circuit block 5 perform an operation in time period 4' that is identical with the operation in time period 2', and perform an operation in time period 4" that is identical with the operation in time period 2".

By repeating the operations of the time periods 2', 2", 3' and 3", the local A/D conversions of the n and (n+1) are performed in pipelined fashion.

Figure 6:
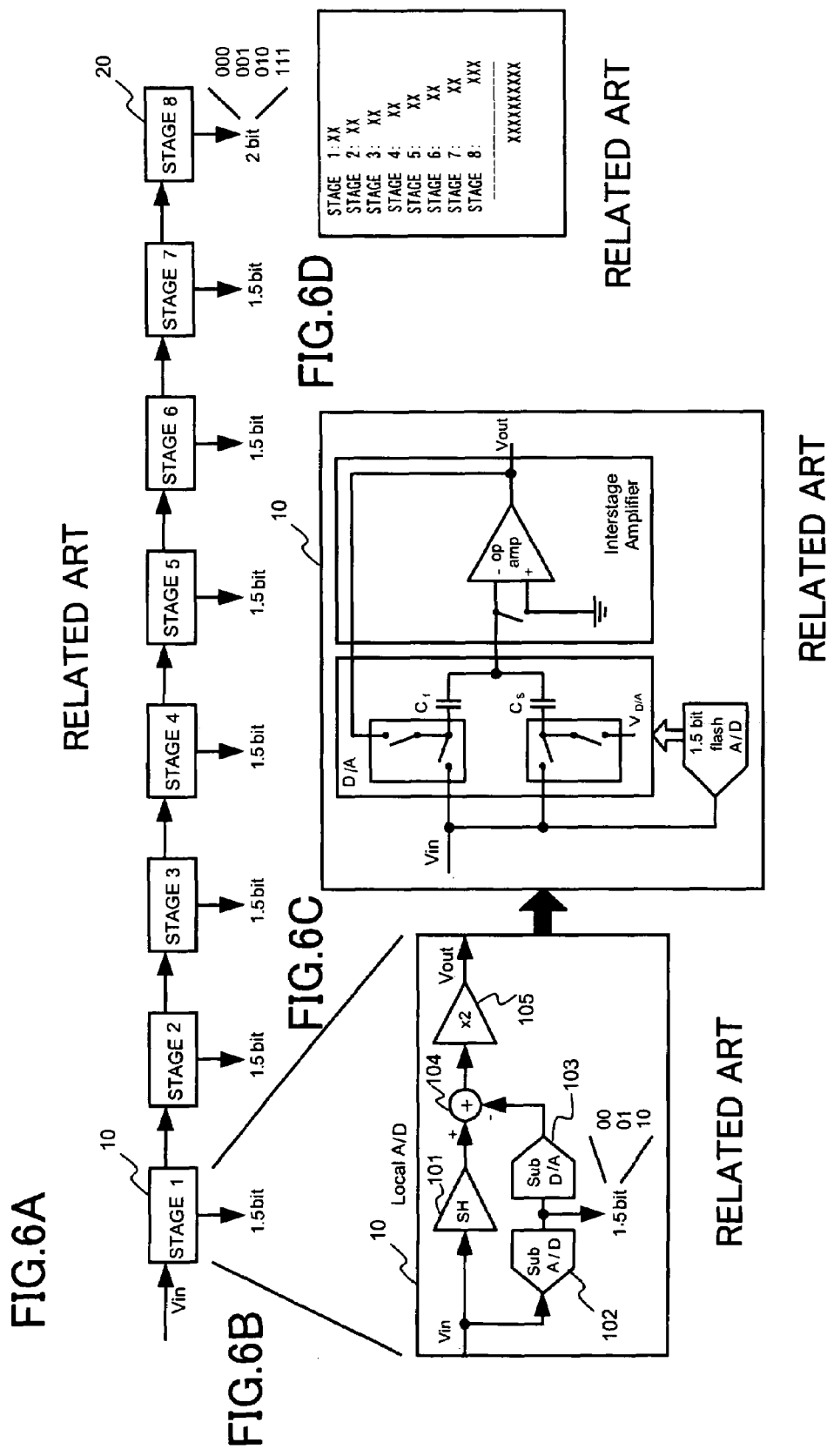
FIGS. 6A, 6B, 6C and 6D are diagrams describing the configuration of a typical example of a pipeline A/D converting circuit.
Figure 7:
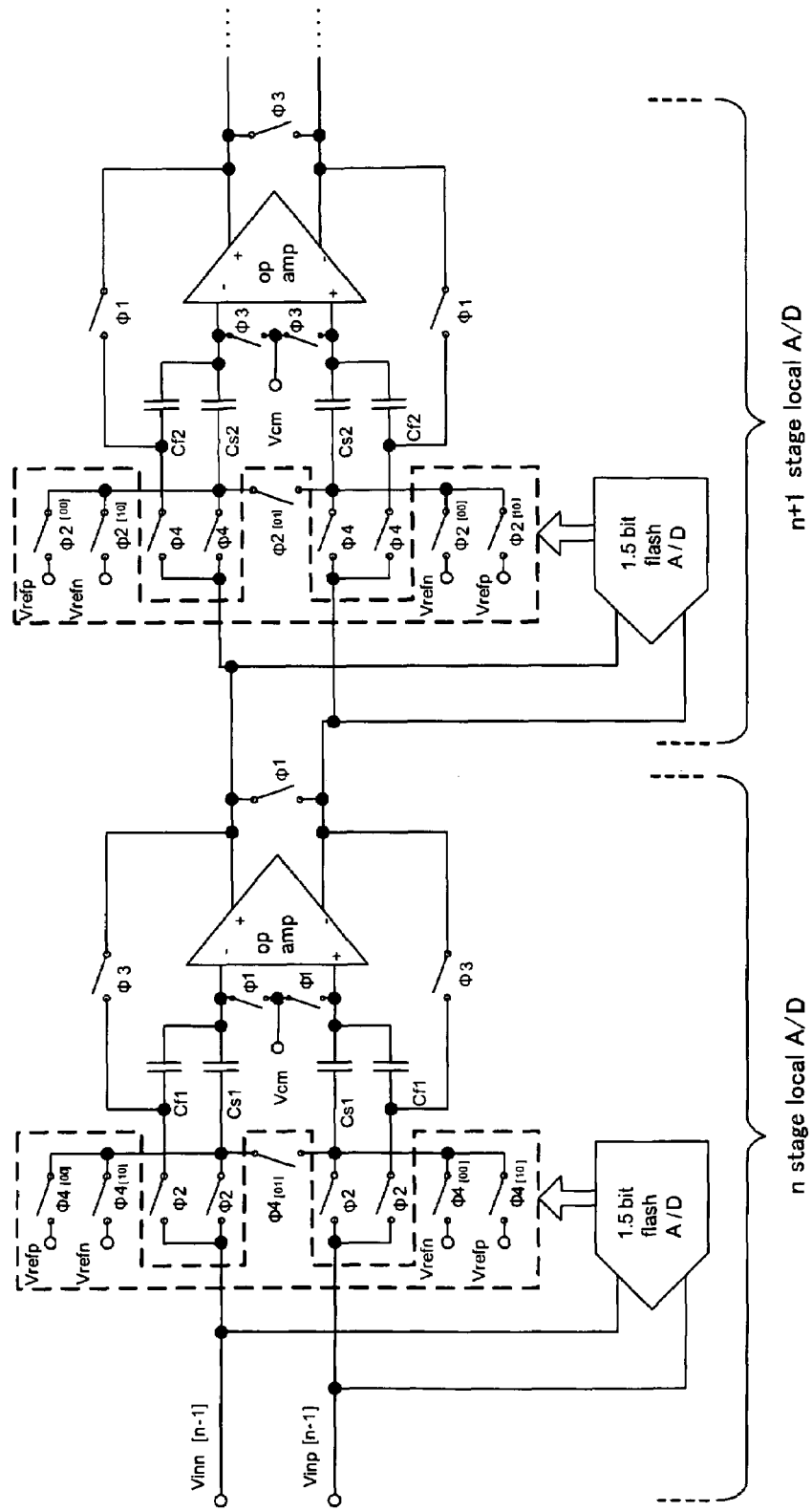
FIG. 7 is a diagram illustrating the structure of a local A/D converter.
Figure 8:
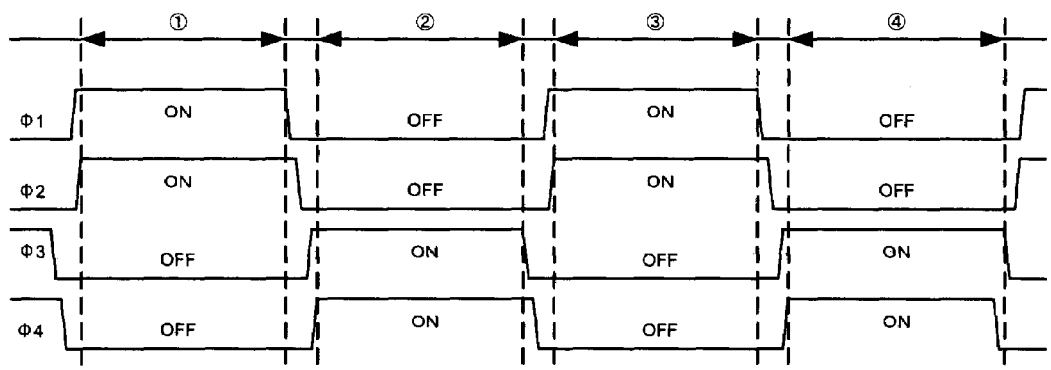
FIG. 8 is a diagram illustrating timing waveforms of control signals in FIG. 7.
Figure 9:
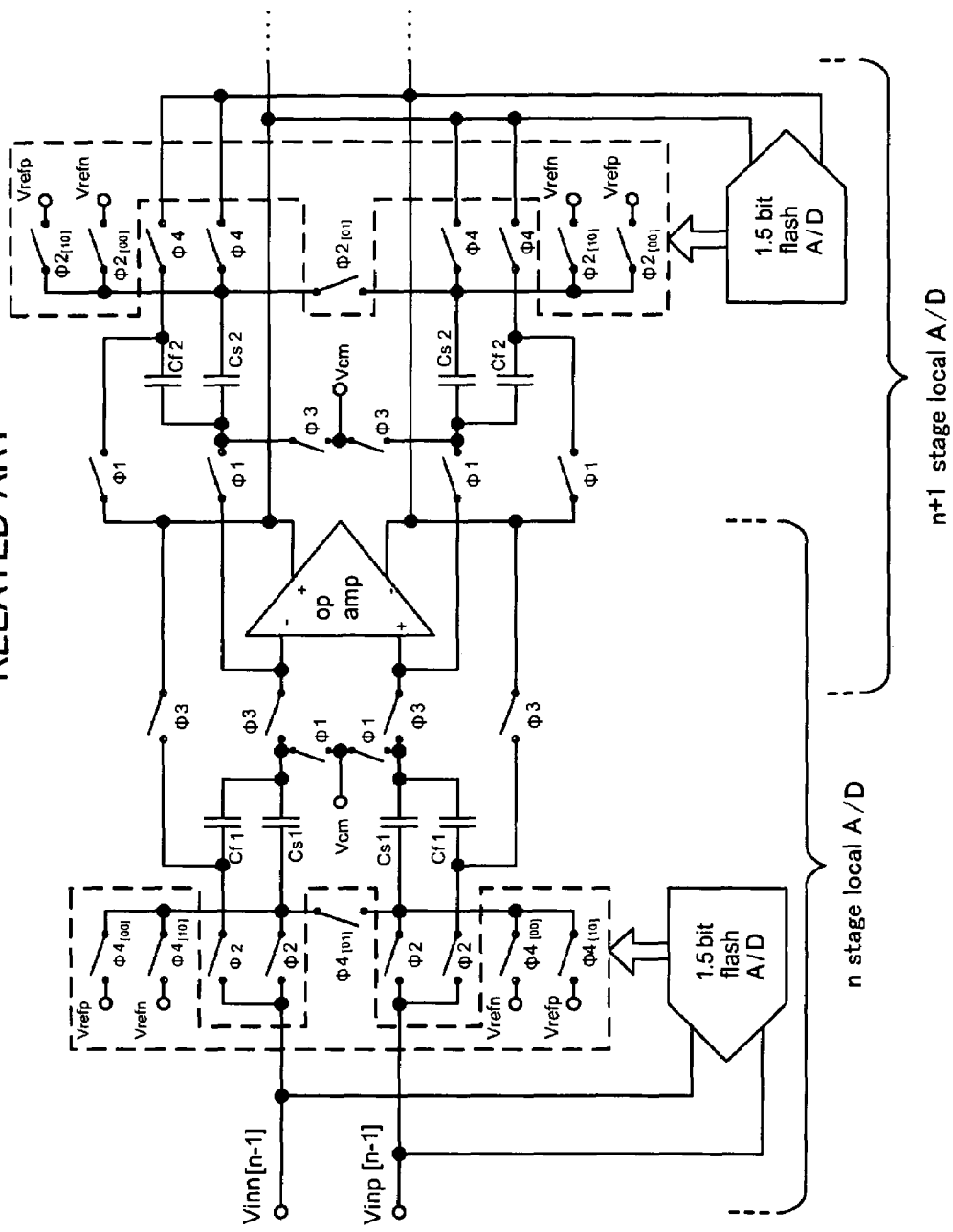
FIG. 9 is a diagram illustrating the structure of a typical example of shared-amplifier A/D converter.
Figure 10:
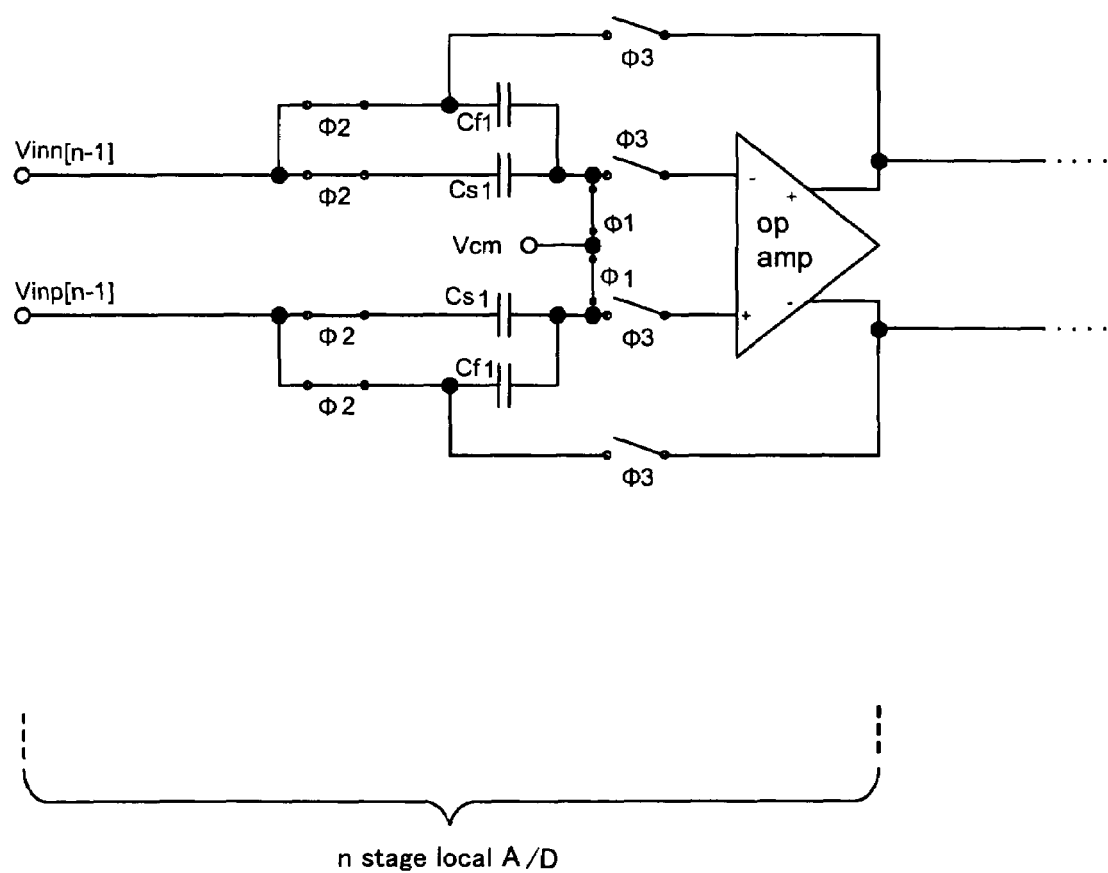
FIG. 10 is a diagram useful in describing the circuit operation of FIG. 9.
Figure 11:
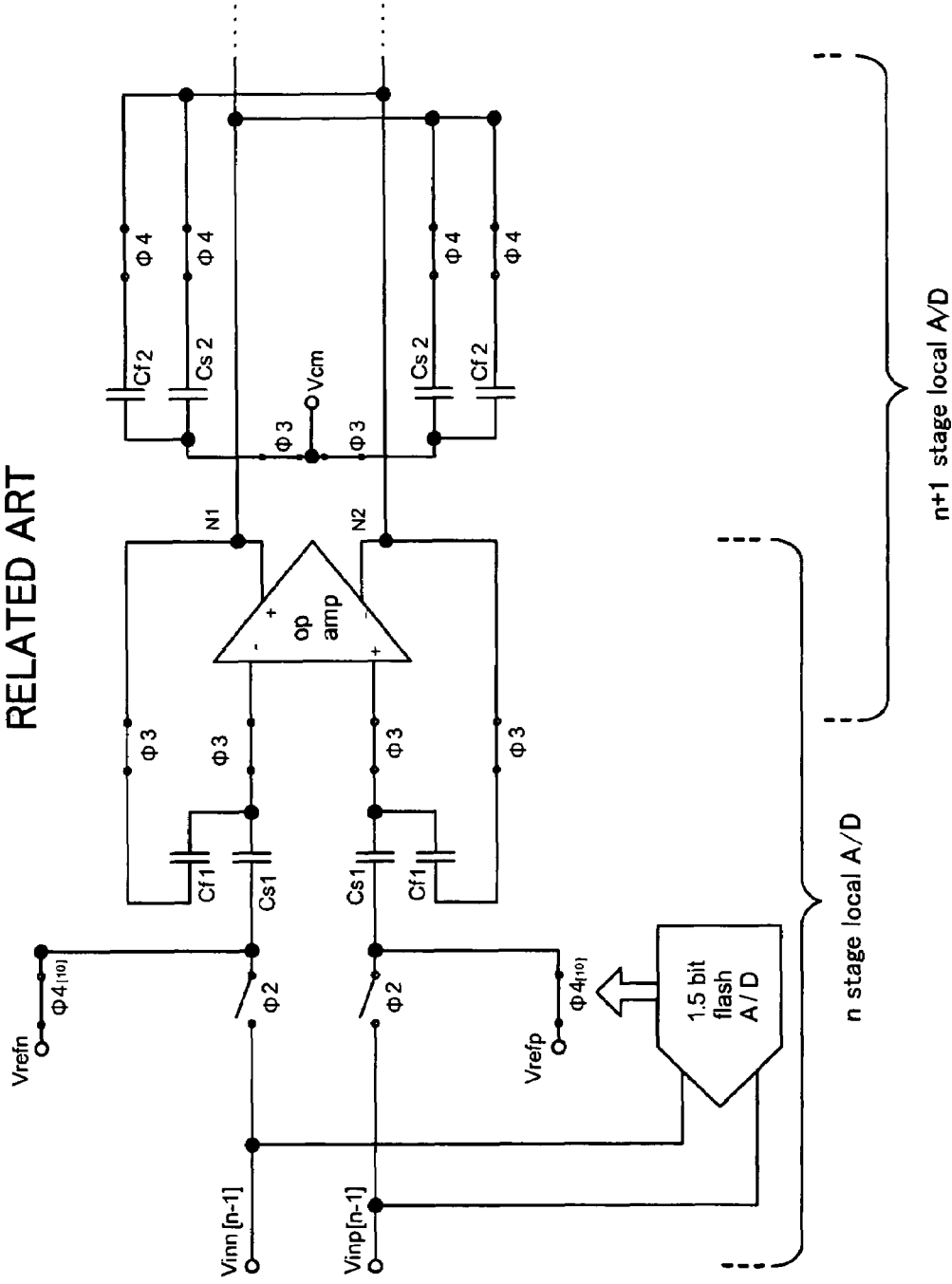
FIG. 11 is a diagram useful in describing the circuit operation of FIG. 9.
Figure 12:
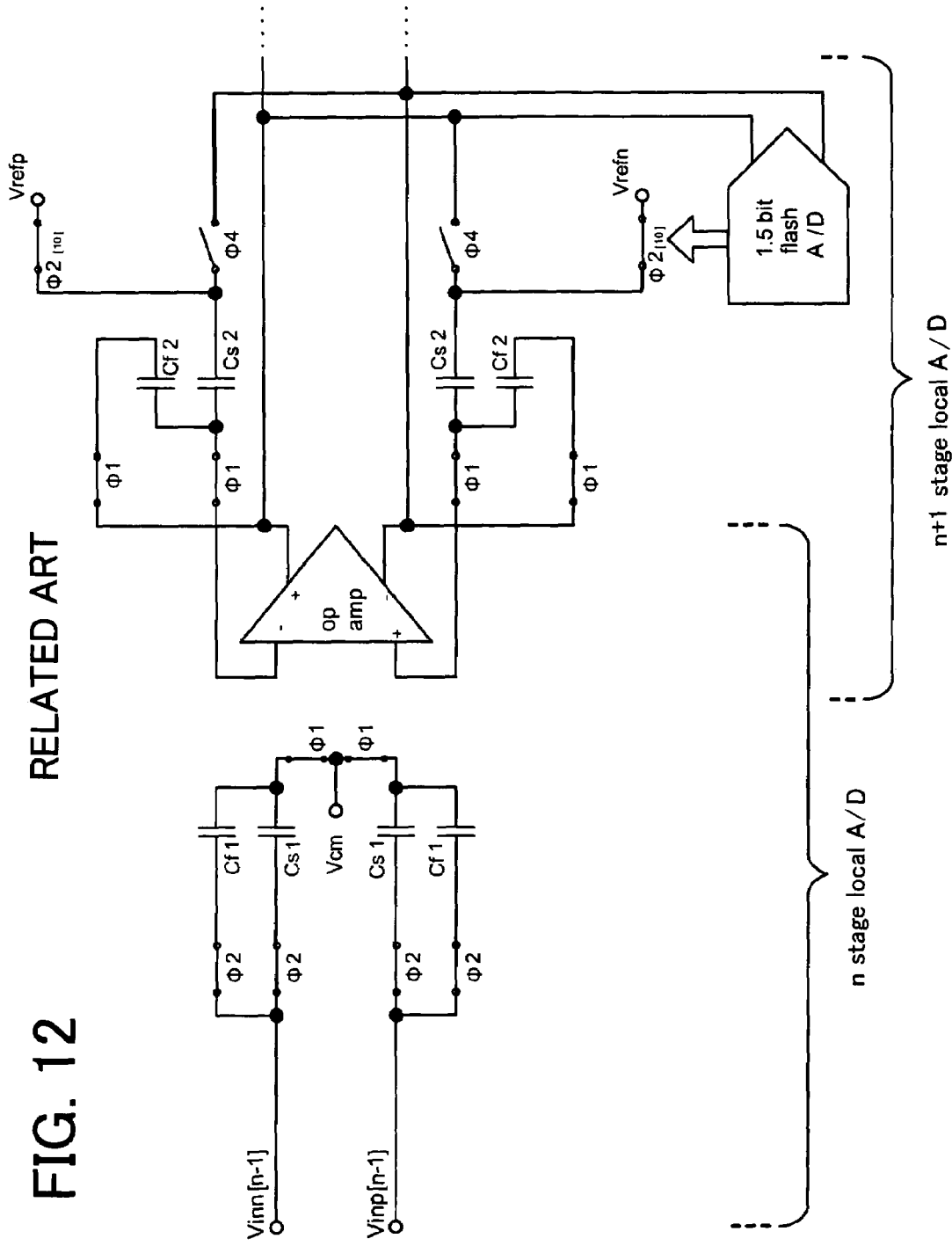
FIG. 12 is a diagram useful in describing the circuit operation of FIG. 9.

In the local A/D of the (n+1) stage that shares the operational amplifier (op amp) 1, the present invention is capable of halving the value of the sampling capacitance under conditions identical with those of FIG. 6 or FIG. 9.

The present invention is capable of canceling error voltage due to an offset produced by the operational amplifier (op amp) 1 at the time of sampling in the (n+1) stage. As a result, a computation error voltage is not produced in the calculation and amplification of the local A/D of the (n+1) stage, and an error voltage can be suppressed to the amount produced by the local A/D of the n stage.

Furthermore, in the present invention, the loads in the local A/D's of the n and (n+1) stages become the sampling capacitance of the (n+2) stage, and therefore the invention can operate at a speed faster than that of the prior art in which the sampling capacitance of the n and (n+1) stages becomes the load. Alternatively, with speed being kept the same, current consumption in the operational amplifier (op amp) can be reduced in comparison with the prior art. This means that the pipeline A/D converting circuit according to the present invention is well suited for inclusion in a semiconductor integrated circuit.

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A pipeline analog-to-digital converting circuit including one stage and a stage succeeding said one stage, each stage comprising:

a sampling capacitor that samples an input signal voltage from a preceding stage;

a sub analog-to-digital converting circuit that converts the input signal voltage from the preceding stage to output a digital signal;

a sub digital-to-analog converter that selects a reference voltage corresponding to the digital signal output from said sub analog-to-digital converter; and an amplifier, for which the sampling capacitor that has sampled the input signal voltage is connected as a feedback capacitor in an operational amplification time period in which said amplifier amplifies a difference voltage between the sampled voltage of the input signal and the reference voltage, said amplifier being shared by said one stage and said succeeding stage, the sampling capacitor of said one stage comprising a plurality of divided sampling capacitors, some of the plurality of divided sampling capacitors in said one stage being adopted as sampling capacitors of said succeeding stage.

2. The pipeline analog-to-digital converting circuit according to claim 1, wherein some of the plurality of divided sampling capacitors in said one stage are used as sampling capacitors of said succeeding stage in the period of operational amplification by said amplifier.

3. The pipeline analog-to-digital converting circuit according to claim 1, wherein in said one stage, during the operational amplification time period, an output voltage of the amplifier is sampled in some of the sampling capacitors of said one stage as an output voltage from said one stage, with an input terminal of the amplifier serving as a reference, and some of the sampling capacitors of said one stage for sampling the output voltage of the amplifier are used as sampling capacitors in said succeeding stage for sampling the output voltage from said one stage; and wherein a reference voltage selected based upon a result of converting the output voltage of the amplifier to a digital signal by the sub analog-to-digital converter of said succeeding stage is applied to a first end of at least one capacitor of sampling capacitors of said one stage that have sampled the output voltage of the amplifier with a second end of said one capacitor being connected to the input terminal of the amplifier;

at least one other capacitor among the sampling capacitors of said one stage that have sampled the output voltage of the amplifier is connected as a feedback capacitor between the output terminal and the input terminal of the amplifier, and a difference voltage between the output voltage from said one stage and the reference voltage is amplified by the amplifier and the output voltage of the amplifier is output as the output voltage of the succeeding stage.

4. The pipeline analog-to-digital converting circuit according to claim 1, comprising as said one stage and as said second stage:

juxtaposed first and second circuit blocks each including first to fourth capacitors for sampling and a sub digital-to-analog converter;

said amplifier shared by said first and second circuit blocks;

one said sub analog-to-digital converter for subjecting input signal voltage from the preceding stage to an analog-to-digital conversion; and another sub analog-to-digital converter for subjecting output voltage of said amplifier to an analog-to-digital conversion, wherein:

a time period in which the analog-to-digital converting operation of said one stage and said succeeding stage is performed is assigned alternately to said first circuit block and said second circuit block, the time period comprising a first half and a second half;

the first half is a period in which said first and second capacitors that have sampled in common an input signal from the preceding stage are connected in parallel between an output terminal and an input terminal of the amplifier, a reference voltage selected by said sub digital-to-analog converter based upon a digital signal that is a result of subjecting the input signal to an analog-to-digital conversion by said one sub analog-to-digital converter is connected to first commonly connected ends of said third and fourth capacitors that have sampled the input signal in common with said first and second capacitors, commonly connected second ends of said third and fourth capacitors are connected to the input terminal of said amplifier and operational amplification is performed in said one stage;

the second half is a period in which said third and fourth capacitors, which have been connected between the reference voltage and the input terminal of said amplifier, are placed in a state isolated from the input terminal of the amplifier, the input signal from the preceding stage and the reference voltage, a first end of one of said first capacitor and second capacitor is disconnected from the output terminal of said amplifier and is connected to a reference voltage selected by said sub digital-to-analog converter based upon a digital signal that is a result of subjecting the output voltage of said amplifier to an analog-to-digital conversion by said other sub analog-to-digital converter, and operational amplification is performed in said succeeding stage; and in a time period in which one circuit block of said first and second circuit blocks is performing the analog-to-digital conversion operation in said one stage and said succeeding stage, the other circuit block of said first and second circuit blocks samples the input signal from the preceding stage in common in a plurality of capacitors of the other circuit block.

5. The pipeline analog-to-digital converting circuit according to claim 1, comprising as said one stage and as said second stage:

first and second circuit blocks; and
first and second sub analog-to-digital converters;
said first circuit block including:
said sub digital-to-analog converter;
said amplifier;
first and second capacitors functioning as sampling capacitors and feedback capacitors; and
third and fourth capacitors functioning as sampling capacitors and capacitors for storing reference voltage;

said second circuit block including:
said sub digital-to-analog converter;
first and second capacitors functioning as sampling capacitors and feedback capacitors; and
third and fourth capacitors functioning as sampling capacitors and capacitors for storing reference voltage; wherein in a time period (1), connections in said first circuit block are as follows:
first ends of said first and second capacitors and first ends of said third and fourth capacitors are connected in common to an input terminal to which a signal from the preceding stage is input, and second ends of said first and second capacitors and second terminals of said third and fourth capacitors are connected in common to an common-mode voltage terminal;

in a time period (2'), connections in said first circuit block are as follows:
the first ends of said first and second capacitors are connected in common to an output terminal of said amplifier, the second ends of said first and second capacitors are connected in common to an input terminal of said amplifier, the first ends of said third and fourth capacitors are connected in common to a reference voltage terminal selected by said sub digital-to-analog converter based upon a digital signal output of said first sub analog-to-digital converter, and the second ends of said third and fourth capacitors are connected in common to the second ends of said first and second capacitors and to the input terminal of said amplifier, whereby operational amplification is performed;

and connections in said second circuit block are as follows:
first ends of said first and second capacitors and first ends of said third and fourth capacitor are connected in common to an input terminal to which a signal from the preceding stage is input, and second ends of the first and second capacitors and second ends of third and fourth capacitors are connected in common to the common-mode voltage terminal;

in a time period (2"), connections in said first circuit block are as follows:

said third and fourth capacitors are disconnected from said amplifier, the output voltage of said amplifier is converted to a digital signal by said second sub analog-to-digital converter, the first end of said second capacitor is connected to an output terminal of said amplifier, the first end of said first capacitor is connected to a reference voltage terminal selected by said sub digital-to-analog converter based upon a digital signal output of said second sub analog-to-digital converter, the second ends of said first and second capacitors are connected in common to the input terminal of said amplifier, whereby operational amplification is performed;

and said second circuit block is held in a state identical with that of the time period (2');

in a time period (3'), connections in said first circuit block are as follows:

the first ends of said first and second capacitors and the first ends of said third and fourth capacitors are connected in common to an input terminal for receiving the signal from the preceding stage, and the second ends of said first and second capacitors and the second ends of said third and fourth capacitors are connected in common to the common-mode voltage terminal;

and connections in said second circuit block are as follows:

the first ends of said first and second capacitors are connected in common to an output terminal of said amplifier, the second ends of said first and second capacitors are connected in common to an input terminal of said amplifier, the first ends of said third and fourth capacitors are connected in common to a reference voltage terminal selected by said sub digital-to-analog converter based upon a digital signal output of said first sub analog-to-digital converter, and second ends of said third and fourth capacitors are connected in common to the second ends of said first and second capacitors and to an input terminal of said amplifier, whereby operational amplification is performed;

in a time period (3"), said first circuit block is held in a state identical with that of the time period (3');

and connections in said second circuit block are as follows:

said third and fourth capacitors are disconnected from said amplifier, the output voltage of said amplifier is converted to a digital signal by said second sub analog-to-digital converter, the first end of said second capacitor is connected to an output terminal of said amplifier, the first end of said first capacitor is connected to a reference voltage terminal selected by said sub digital-to-analog converter based upon a digital signal output of said second sub analog-to-digital converter, the second ends of said first and second capacitors are connected in common to the input terminal of said amplifier, whereby operational amplification is performed;

a switch group for controlling changeover of the connections in the time periods (1) to (3") is provided; and a series of operations in time periods (2'), (2"), (3') and (3") are repeated, thereby performing the analog-to-digital conversions of said one stage and said succeeding stage in a pipeline fashion.

6. A pipeline analog-to-digital converting circuit including N stages (where N is a prescribed positive integer), said circuit including as local analog-to-digital converting circuits of a k stage and (k+1) stage (where k is an integer greater than or equal to 1 and less than or equal to N−2):

juxtaposed first and second circuit blocks each including first to fourth capacitors for sampling and a sub digital-to-analog converter;

an amplifier shared by said first and second circuit blocks; and first and second sub analog-to-digital converters; wherein a time period in which the analog-to-digital converting operation of said k stage and said (k+1) stage is performed is assigned alternately to said first circuit block and said second circuit block, the time period comprising a first half and a second half; wherein the first half is a period in which said first and second capacitors that have sampled in common an input signal from the preceding stage are connected in parallel between an output terminal and an input terminal of said amplifier, a reference voltage selected by said sub digital-to-analog converter based upon a digital signal that is a result of subjecting the input signal to an analog-to-digital conversion by said first sub analog-to-digital converter is connected to first commonly connected ends of said third and fourth capacitors that have sampled the input signal in common with said first and second capacitors, commonly connected second ends of said third and fourth capacitors are connected to the input terminal of said amplifier and operational amplification is performed in said k stage; wherein the second half is a period in which said third and fourth capacitors, which have been connected between the reference voltage and the input terminal of said amplifier, are placed in a state isolated from the input terminal of the amplifier, the input signal from the preceding stage and the reference voltage, a first end of one of said first capacitor and second capacitor is disconnected from the output terminal of said amplifier and is connected to a reference voltage selected by said sub digital-to-analog converter based upon a digital signal that is a result of subjecting the output voltage of said amplifier to an analog-to-digital conversion by said second sub analog-to-digital converter, and operational amplification is performed in said (k+1) stage; and wherein in a time period in which one circuit block of said first and second circuit blocks is performing the analog-to-digital conversion operation in said k stage and said (k+1) stage, the other circuit block of said first and second circuit blocks samples the input signal from the preceding stage in common in a plurality of capacitors of the other circuit block.

7. A pipeline analog-to-digital converting circuit including N stages (where N is a prescribed positive integer), said circuit including as local analog-to-digital converting circuits of a k stage and (k+1) stage (where k is an integer greater than or equal to 1 and less than or equal to N−2):

first and second circuit blocks; and a first sub analog-to-digital converter and a second sub analog-to-digital converter;

wherein said first circuit block comprises:

a sub digital-to-analog converter;

said amplifier;

first and second capacitors functioning as sampling capacitors and feedback capacitors; and third and fourth capacitors functioning as sampling capacitors and capacitors for storing reference voltage;

said second circuit block comprises:
a sub digital-to-analog converter;
first and second capacitors functioning as sampling capacitors and feedback capacitors; and
third and fourth capacitors functioning as sampling capacitors and capacitors for storing reference voltage; wherein in a time period (1), connections in said first circuit block are as follows:
first ends of said first and second capacitors and first ends of said third and fourth capacitors are connected in common to an input terminal to which a signal from the preceding stage is input, and second ends of said first and second capacitors and second terminals of said third and fourth capacitors are connected in common to an common-mode voltage terminal;

in a time period (2'), connections in said first circuit block are as follows:
the first ends of said first and second capacitors are connected in common to an output terminal of said amplifier, the second ends of said first and second capacitors are connected in common to an input terminal of said amplifier, the first ends of said third and fourth capacitors are connected in common to a reference voltage terminal selected by said sub digital-to-analog converter based upon a digital signal output of said first sub analog-to-digital converter, and the second ends of said third and fourth capacitors are connected in common to the second ends of said first and second capacitors and to the input terminal of said amplifier, whereby operational amplification is performed;

and connections in said second circuit block are as follows:
first ends of said first and second capacitors and first ends of said third and fourth capacitor are connected in common to an input terminal to which a signal from the preceding stage is input, and second ends of the first and second capacitors and second ends of third and fourth capacitors are connected in common to the common-mode voltage terminal;

in a time period (2"), connections in said first circuit block are as follows:
said third and fourth capacitors are disconnected from said amplifier, the output voltage of said amplifier is converted to a digital signal by said second sub analog-to-digital converter, the first end of said first capacitor is connected to an output terminal of said amplifier, the first end of said second capacitor is connected to a reference voltage terminal selected by said sub digital-to-analog converter based upon a digital signal output of said second sub analog-to-digital converter, the second ends of said first and second capacitors are connected in common to the input terminal of said amplifier, whereby operational amplification is performed;

and said second circuit block is held in a state identical with that of the time period (2');

in a time period (3'), connections in said first circuit block are as follows:
the first ends of said first and second capacitors and the first ends of said third and fourth capacitors are connected in common to an input terminal for receiving the signal from the preceding stage, and the second ends of said first and second capacitors and the second ends of said third and fourth capacitors are connected in common to the common-mode voltage terminal;

and connections in said second circuit block are as follows:
the first ends of said first and second capacitors are connected in common to an output terminal of said amplifier, the second ends of said first and second capacitors are connected in common to an input terminal of said amplifier, the first ends of said third and fourth capacitors are connected in common to a reference voltage terminal selected by said sub digital-to-analog converter based upon a digital signal output of said first sub analog-to-digital converter, and second ends of said third and fourth capacitors are connected in common to the second ends of said first and second capacitors and to an input terminal of said amplifier, whereby operational amplification is performed;

in a time period (3"), said first circuit block is held in a state identical with that of the time period (3');

and connections in said second circuit block are as follows:
said third and fourth capacitors are disconnected from said amplifier, the output voltage of said amplifier is converted to a digital signal by said second sub analog-to-digital converter, the first end of said second capacitor is connected to an output terminal of said amplifier, the first end of said first capacitor is connected to a reference voltage terminal selected by said sub digital-to-analog converter based upon a digital signal output of said second sub analog-to-digital converter, the second ends of said first and second capacitors are connected in common to the input terminal of said amplifier, whereby operational amplification is performed;

a switch group for controlling changeover of the connections in the time periods (1) to (3") is provided; and a series of operations in time periods (2'), (2"), (3') and (3") are repeated, thereby performing the local analog-to-digital conversions of said k stage and said (k+1) stage in a pipeline fashion.

8. The pipeline analog-to-digital converting circuit according to claim 4, wherein said amplifier comprises a differential-input, differential-output operational amplifier having inverting and non-inverting input terminals and inverting and non-inverting output terminals; and
a set of said first and second capacitors and third and fourth capacitors is provided for the inverting input terminal and for the non-inverting input terminal.

9. The pipeline analog-to-digital converting circuit according to claim 6, wherein said amplifier comprises a differential-input, differential-output operational amplifier having inverting and non-inverting input terminals and inverting and non-inverting output terminals; and
a set of said first and second capacitors and third and fourth capacitors is provided for the inverting input terminal and for the non-inverting input terminal.

10. The pipeline analog-to-digital converting circuit according to claim 7, wherein said amplifier comprises a differential-input, differential-output operational amplifier having inverting and non-inverting input terminals and inverting and non-inverting output terminals; and
a set of said first and second capacitors and third and fourth capacitors is provided for the inverting input terminal and for the non-inverting input terminal.

11. The pipeline analog-to-digital converting circuit according to claim 5, wherein a sum of lengths of the time periods (2') and (2") is made identical with a sum of lengths of the time periods (3') and (3").

12. The pipeline analog-to-digital converting circuit according to claim 7, wherein a sum of lengths of the time periods (2') and (2") is made identical with a sum of lengths of the time periods (3') and (3").

13. A semiconductor integrated circuit device having the pipeline analog-to-digital converting circuit set forth in claim 1.

14. A semiconductor integrated circuit device having the pipeline analog-to-digital converting circuit set forth in claim 6.

15. A semiconductor integrated circuit device having the pipeline analog-to-digital converting circuit set forth in claim 7.

16. The pipeline analog-to-digital converting circuit according to claim 1, wherein a function of a local analog-to-digital converting circuit of said succeeding stage is implemented with a sampling capacitance smaller than a sampling capacitance of said one stage.

17. The pipeline analog-to-digital converting circuit according to claim 16, wherein said sampling capacitors cancel a voltage error of said succeeding stage.

18. The pipeline analog-to-digital converting circuit according to claim 17, wherein a computation error voltage in said local analog-to-digital converting circuit of said succeeding stage is canceled by storing said computation error voltage in the sampling capacitors of said succeeding stage as a voltage across input and output terminals of an operational amplifier in said operational amplification time period of said one stage.

19. The pipeline analog-to-digital converting circuit according to claim 1, further comprising at least some but fewer than all of the plurality of divided sampling capacitors in said one stage being adopted as sampling capacitors of said succeeding stage.

20. The pipeline analog-to-digital converting circuit according to claim 19, wherein a function of a local analog-to-digital converting circuit of said succeeding stage is implemented with a sampling capacitance smaller than a sampling capacitance of said one stage.

21. The pipeline analog-to-digital converting circuit according to claim 20, wherein said sampling capacitors cancel a voltage error of said succeeding stage.

22. The pipeline analog-to-digital converting circuit according to claim 21, wherein a computation error voltage in said local analog-to-digital converting circuit of said succeeding stage is canceled by storing said computation error voltage in the sampling capacitors of said succeeding stage as a voltage across input and output terminals of an operational amplifier in said operational amplification time period of said one stage.

* * * * *